(12) United States Patent
Sugibayashi

(10) Patent No.: US 6,246,622 B1
(45) Date of Patent: Jun. 12, 2001

(54) SEMICONDUCTOR MEMORY DEVICE

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/618,757

(22) Filed: Jul. 18, 2000

(30) Foreign Application Priority Data

Jul. 30, 1999 (JP) .................................................. 11-218189

(51) Int. Cl.[7] ...................................................... G11C 7/00
(52) U.S. Cl. ............................................ 365/210; 365/168
(58) Field of Search ..................................... 365/210, 190, 365/168, 149, 185.2

(56) References Cited

U.S. PATENT DOCUMENTS

| | | | | |
|---|---|---|---|---|
| 4,661,929 | * | 4/1987 | Aoki et al. ............................ | 365/168 |
| 5,612,912 | * | 3/1997 | Gillingham ........................... | 365/149 |
| 5,623,440 | * | 4/1997 | Saito .................................... | 365/168 |
| 5,978,255 | * | 11/1999 | Naritake .............................. | 365/168 |

* cited by examiner

*Primary Examiner*—Tan T. Nguyen
(74) *Attorney, Agent, or Firm*—Young & Thompson

(57) ABSTRACT

The present invention provides a multi-value DRAM that does not require additional surface area, has a low cost, and has a good yield. A 4-value memory cell is disposed at the intersection of a word line WL and sub-bit lines BLNx0. A potential corresponding to 11, 10, 01, and 00 is written to the dunmmy cell disposed at the intersection of the sub-bitline connected to the dummy word lines DWLN and DWLT and the SSAs 31 and 32. The SSA30 outputs the data in the memory cell and the reference levels 0x and 1x on the sub-bit lines BLTx0 to the main bit lines GBLN0 and GBLT0. The SSA31 balances the potentials of the dummy cell connected to both dummy word lines and outputs the reference levels 11 and 10 to the main bit line GBLN4. Similarly, the SSA32 balances the potentials of both dummy cells, and outputs the reference levels 01 and 00 to the main bit line GBLT4. The MSA 33 discriminates the upper bit UPBIT and the lower bit LWBIT of the data based on the potentials on the 4 main bit lines.

17 Claims, 20 Drawing Sheets

MOVEMENT OF DATA-LEVEL

MOVEMENT OF REFERENCE LEVEL

FIG. 15A

| VALUE/CELL | TG TIME DIVISION | TIME DIVISION IN MSA | NUMBER OF SENSINGS |
|---|---|---|---|
| 4 | 4 | 3 | 1 2 |
| 8 | 4 | 7 | 2 8 |
| 1 6 | 4 | 1 5 | 6 0 |

FIG. 15B

| VALUE/CELL | TG TIME DIVISION | TIME DIVISION IN MSA | NUMBER OF SENSINGS |
|---|---|---|---|
| 4 | 8 | 1 | 8 |
| 8 | 1 6 | 1 | 1 6 |
| 1 6 | 3 2 | 1 | 3 2 |

FIG. 15C

| VALUE/CELL | TG TIME DIVISION | TIME DIVISION IN MSA | NUMBER OF SENSINGS |
|---|---|---|---|
| 4 | 4 | 1 | 4 |
| 8 | 8 | 1 | 8 |
| 1 6 | 1 6 | 1 | 1 6 |

FIG. 15D

| VALUE/CELL | TG TIME DIVISION | TIME DIVISION IN MSA | NUMBER OF SENSINGS |
|---|---|---|---|
| 4 | 2 | 1 | 2 |
| 8 | 4 | 1 | 4 |
| 1 6 | 8 | 1 | 8 |

SEMICONDUCTOR MEMORY DEVICE

BACKGROUND OF THE INVENTION

1. Field of the Invention

The present invention relates to a semiconductor memory device exemplified for example by DRAM (Dynamic Random Access Memory), and in particular to a semiconductor memory device that stores multi-value data having more than two values in a memory cell.

2. Description of the Related Art

A 4-value DRAM disclosed in Japanese Unexamined Patent Application, First Publication, No. Hei 9-320280, is a first example of conventional art related to multi-value semiconductor memory devices. FIG. 21 extracts from the structure of the DRAM as a whole one memory cell and a circuit for reading and writing that memory cell, to illustrate the circuit that appears in this publication more schematically. Thus, a summary of the read operation from the memory cell will be described below.

Moreover, the memory cell 100 shown in the figure holds a potential depending on the data it stores, and for example, when the electric source potential is VCC, holds 0, (⅓) VCC, (⅔) VCC, and VCC according respectively to the data 00, 01, 10, and 11. In addition, in this first example of conventional art, a layered bit line structure comprising a main bit line and a sub-bit line is used, and a sense amplifier structure comprising a main sense amplifier (not illustrated) and a sub-sense amplifier 101 is used.

First, the main bit lines GBLT and GBLN and the sub-bit lines BLTU, BLTL, BLNU, and BLNL are all precharged to (½) VCC. Next, by setting the signal TGL at L level, transistors (sometimes abbreviated "Tr" hereinbelow) Q100 and TrQ101 are turned OFF. Thereby, the sub-bit lines BLTU and BLTL, which are on either side of the sense amplifier 101, are cut off from each other, and the sub-bit lines BLNU and BLNL are cut off from each another. Next, the potential held in the memory cell 100 is read out to the sub-bit line BLTU by activating the word line WL, and a difference in potential is generated between the sub-bit lines BLNU and BLTU that depends on the data stored by the memory cell 100.

Next, the signal RS corresponding to the lead switch is set at H level, and the TrQ 102 and TrQ 103 in the sub-sense amplifier 101 are turned ON. Thereby, the sub-sense amplifier 101 transmits to the main bit lines GBLT and GBLN the sense results depending on the difference in potential between the sub-bit lines BLNU and BLTU via TrQ 104 and TrQ 105, and the above-described TrQ 103 and TrQ 102. Thus, the signal RS is restored to L level, and at the same time, reading of the upper bit is carried out by amplifying the difference in potential between the main bit lines GBLT and GBLN by the main sense amplifier (not illustrated). At this time, simultaneously the signal CPS is set at H level and TrQ 106 and TrQ 107 are turned ON, and via capacitors 102 and 103 that hold a capacitance ("⅓ Cs" in the figure) of ⅓ of the memory cell 100, the potential fluctuation of the main bit lines GBLT and GBLN is respectively transmitted to the sub-bit lines BLNU and BLTU. Thereby, if the data stored in memory cell 100 is 10 or 01, the size relationship of the potential between the sub-bit lines BLNU and BLTU reverses. Subsequently, by restoring the signal CPS to L level, the main bit lines GBLT and GBLN are cut off from each other and the sub-bit lines BLNU and BLTU are cut off from each other, and at the same time by setting the signal TGU at L level and tuning TrQ 108 and TrQ 109 OFF, the sub-bit lines BLTU and BLNU are cut offfrom the sub-sense amplifier 101. Next, TrQ 110 and TrQ 111 are turned ON by setting the signal WSU at H level, and the amplified potential of the main bit lines GBLT and GBLN are respectively written to the sub-bit lines BLTU and BLNU. Next, after restoring the signal WSU to L level, by setting the signal RS at H level, the results of the sensing that depends on the difference in potential between the sub-bit lines BLNL and BLTL are transmitted to the main bit lines GBLT and GBLN. In this manner, like the case of the upper bit, reading of the lower bit is carried out.

Next, TrQ 112 and TrQ 113 are turned on by setting the signal WSL at H level, and the potential of the main bit lines GBLT and GBLN are written to the sub-bit lines BLTL and BLNL. At this time, simultaneously TrQ 110 and TrQ 101 are turned ON by setting the signal TGL at H level. Next, by setting the signal TGU at H level, the sub-bit lines BLTU and BLTL are connected and the sub-bit lines BLNU and BLNL are connected. Next, by setting the signal TGU to H level, the sub-bit lines BLTU and BLTL are connected and the sub-bit lines BLNU and BLNL are connected. As a result, capacitive coupling of both bit lines occurs, and the potential of the sub-bit line BLTU and the potential that is held in the memory cell 100 before reading are equalized. Thus, by activating the word line WL, the potential of memory cell 100 which has been destroyed by this reading operation is rewritten from the sub-bit line BLTU.

As a second example of conventional art related to a multi-value semiconductor device, the technology disclosed, for example, in Masakazu Aoki et al., "A 16-Levels/Cell Dynamic Memory." IEEE International Solid-State Circuits Conference (ISSCC), 1985, *Digest of Technical Papers*, pp. 246–247, is known. This publication discloses a method wherein the reading of multi-value data stored in a memory cell and writing multi-value data into a memory cell is carried out by a stepwise change by oscillating the potential of the word line to cause a stepwise change that depends on the data stored in the memory cell.

As described above, in the first example of conventional art, the result of sensing the upper bit is fed back in order to sense the lower bit. Due to this, in the first example of conventional art, a feedback capacitor must be provided for each sub-sense amplifier. Here, as described above, the feedback capacitor has a capacitance of "⅓ Cs", corresponding to ⅓ the capacitance Cs of the memory cell, and thus a memory cell that differs from the standard memory cell is required. In the first example of conventional art, a capacitor having this special capacitance is effectively realized by serially connecting three capacitors equivalent to those provided in the memory cell. However, when the capacitor is realized by such a serial connection, a large area is required, and this in turn causes an increase in cost.

On this point, one could consider making the capacitor having this capacitance using the gate capacitance of transistors. However, because the properties of the variance in gate capacitance and the properties of the variance in memory cell capacitance differ from each other, in a method that realizes this capacitor using gate capacitance, the variance of capacitance exceeds the permissible range, and there are problems in really applying this to actual products. In addition to the problem of this variance in capacitance, there is the problem that the variance in the capacitance of this feedback capacitor influences the yield. Furthermore, in comparison to the main sense amplifier, because feedback capacitors must be respectively provided for a plurality of sub-sense amplifiers, the above-described problem becomes severe.

In the above-described second example of conventional art, there is the problem that the yield is low because the variance of the threshold of the memory cells, which are much more numerous than SSAs, influences the operational margin.

SUMMARY OF THE INVENTION

In consideration of the above-described problems, it is an object of the present invention to provide a multi-value semiconductor memory device that does not require a feedback capacitor or require a stepwise change in the potential of a word line, and further has a small area, low cost, and high yield.

In order to solve the above-described problem, the first aspect of the present invention is characterized in providing a dummy cell pair that respectively stores the potentials corresponding to each value of multi-value data stored in memory cells; a plurality of SSAs that, depending on which among a plurality of sub-arrays that form a memory cell array, a memory cell activated by a selected word line belongs to, acts as a memory sub-sense amplifier (abbreviated "the SSA" hereinbelow) that senses and outputs to a main bit line the potential of this multi-value data read out from the memory cell via a sub-bit line, or acts as a dummy SSA that generates and outputs to a main bit line that is different from this main bit line a reference level that discriminates between this multi-value data by balancing the potentials output from the dummy cell pair via a sub-bit line; and a main sense amplifier (abbreviated hereinbelow "the MSA") that discriminates the value of the multi-value data based on the potential of the multi-value data output to each main bit line and each reference level.

In addition, in a second aspect of the present invention according to the first aspect, the plurality of dummy SSAs sequentially outputs by time division each reference level to the sub-bit lines, and the MSA discriminates the value of this multi-value data by sequentially comparing the potential of this multi-value data to each reference level.

In addition, in a third aspect of the present invention according to the first aspect, the output of the plurality of SSAs that sense the memory cells that are driven by the same word line is supplied to the same main bit line by time division, and at the same time the dummy cell pairs sensed by the plurality of dummy SSAs are driven by an identical dummy word line pair, a main bit line that differs from the main bit lines are supplied with each of the reference levels and one of the plurality of memory SSAs, the potential of each of the multi-value data from the plurality of dummy SSAs, and all reference levels are output simultaneously, and the values of each of the multi-value data that the MSA senses by each memory SSA are sequentially discriminated.

In addition, in a fourth aspect of the present invention according to the first aspect, the output of the plurality of SSAs that sense the memory cells that are driven by the same word line is supplied to a plurality of main bit lines, and at the same time the dummy cell pairs sensed by the plurality of dummy SSAs are driven by identical dummy word line pairs, each of the reference levels is supplied to separate main bit lines that are different from the plurality of main bit lines and respectively distributed to the plurality of the MSAs and the plurality of memory SSAs and the all potentials of the multi-value data from the plurality of dummy SSAs, and all reference levels are output simultaneously, and all the values of the multi-value data that the plurality of the MSAs sense by the plurality of memory SSAs are simultaneously discriminated.

In addition, in a fifth aspect of the present invention according to any of the first through fourth aspects, a switch means is provided for separating the word line that drives the memory cell that is to be read out from the main bit line, the same number of the MSAs as the above plurality of the MSAs are disposed surrounding this switch means, the values of the multi-value data of the memory cells that these MSAs drive simultaneously by the word lines are discriminated in parallel.

In addition, in a sixth aspect of the present invention according to any of the first through fifth aspects, this memory SSA generates and outputs reference levels for distinguishing the highest bit of the multi-value data in the sub-bit line forming a pair with the sub-bit line for reading the multi-value data, and outputs the reference levels to a main bit line that is different from the main bit line that outputs the potentials of the multi-value data.

In addition, in a seventh aspect of the present invention according to the sixth aspect, the MSA switches the potentials on the two main bit lines depending on whether the potential of the data in the selected memory cell is read by either of two main bit lines among the two main bit lines carrying the respective reference levels that distinguish the potential of the multi-value data and the highest bit of the multi-value data.

In addition, in an eighth aspect of the present invention according to the sixth or seventh aspects, after passage of a specified time interval during which the noise generated on the sub-bit line has settled, this noise being generated under certain conditions and propagating via the word line, the MSA compares the reference levels output by the dummy SSAs to the potentials of the data of the memory cells after it compares the reference levels output by the memory SSAs and the potentials of the data of the memory cells.

In addition, in a ninth aspect of the present invention according to any of the first through eighth aspects, an SSA has an offset cancel means for canceling the offset due to the difference in threshold voltages that exists between the sense transistor pairs that respectively sense the potential of the sub-bit line pairs.

In addition, in a tenth aspect of the present invention according to any of the first through ninth aspects, among the potentials corresponding to each value of the multi-value data, the potentials, excluding the ground potential and the inner power source potential, are reduced at least to the same specified potential.

In addition, in an eleventh aspect of the present invention according to any of the first through tenth aspects, other than these dummy cell pairs, a redundant dummy cell pair is connected to each of the dummy SSAs via a sub-bit line pair.

In addition, in a twelfth aspect of the present invention according to any of the first through eleventh aspects, except for the ground potential and the internal power source potential, potentials corresponding to each value of the multi-value data are respectively generated by a pseudo-power source circuit.

In addition, in a thirteenth aspect of the present invention according to the twelfth aspect, a sub-bit line in the standby state is charged with a potential generated by this pseudo-power source circuit.

In addition, in a fourteenth aspect of the present invention according to the twelfth and thirteenth aspects, the MSA uses the output of this pseudo-power source circuit that corresponds to the potential of the multi-value data obtained by discrimination, and carries out rewriting of the memory cell, which is carried out by a process of reading from this memory cell.

In addition, in a fifteenth aspect of the present invention according to the thirteenth aspect, by balancing the potentials of the pair of sub-bit lines charged by a potential generated by the pseudo-power source circuit, the reference levels that discriminate the highest bit of the multi-value data according to the sixth aspect are generated.

In addition, in the sixteenth aspect of the present invention according to any of the first through fifteenth aspects, rewriting of the dummy cell pair, which is carried out by a process of reading from the memory cell, is carried out by the dummy SSA.

In addition, in a seventeenth aspect of the present invention according to any of the first through sixteenth aspects, the dummy cell pair and the dummy word line pair that drives this dummy cell pair acquire the same properties as a memory cell and the word line that drives the memory cell.

BRIEF DESCRIPTION OF THE DRAWINGS

FIG. 2A is an explanatory drawing showing the movement of the data levels; FIG. 2B is an explanatory drawing showing the movement of the reference levels.

FIGS. 15A, B, C, and D are drawings contrasting the number of TG time divisions, the number of time divisions in an MSA, and the number of sensings to each level of the respective multi-value levels.

PREFERRED EMBODIMENTS OF THE PRESENT INVENTION

Below, each embodiment of the present invention will be explained referring to the figures. Moreover, in each embodiment explained below, a 4-value DRAM is treated as a concrete example of a multi-value semiconductor device, but the embodiments of the present invention are not limited thereto, and can be applied to a semiconductor memory device storing an arbitrary number of multi-value levels.

First Embodiment

Figure 1:
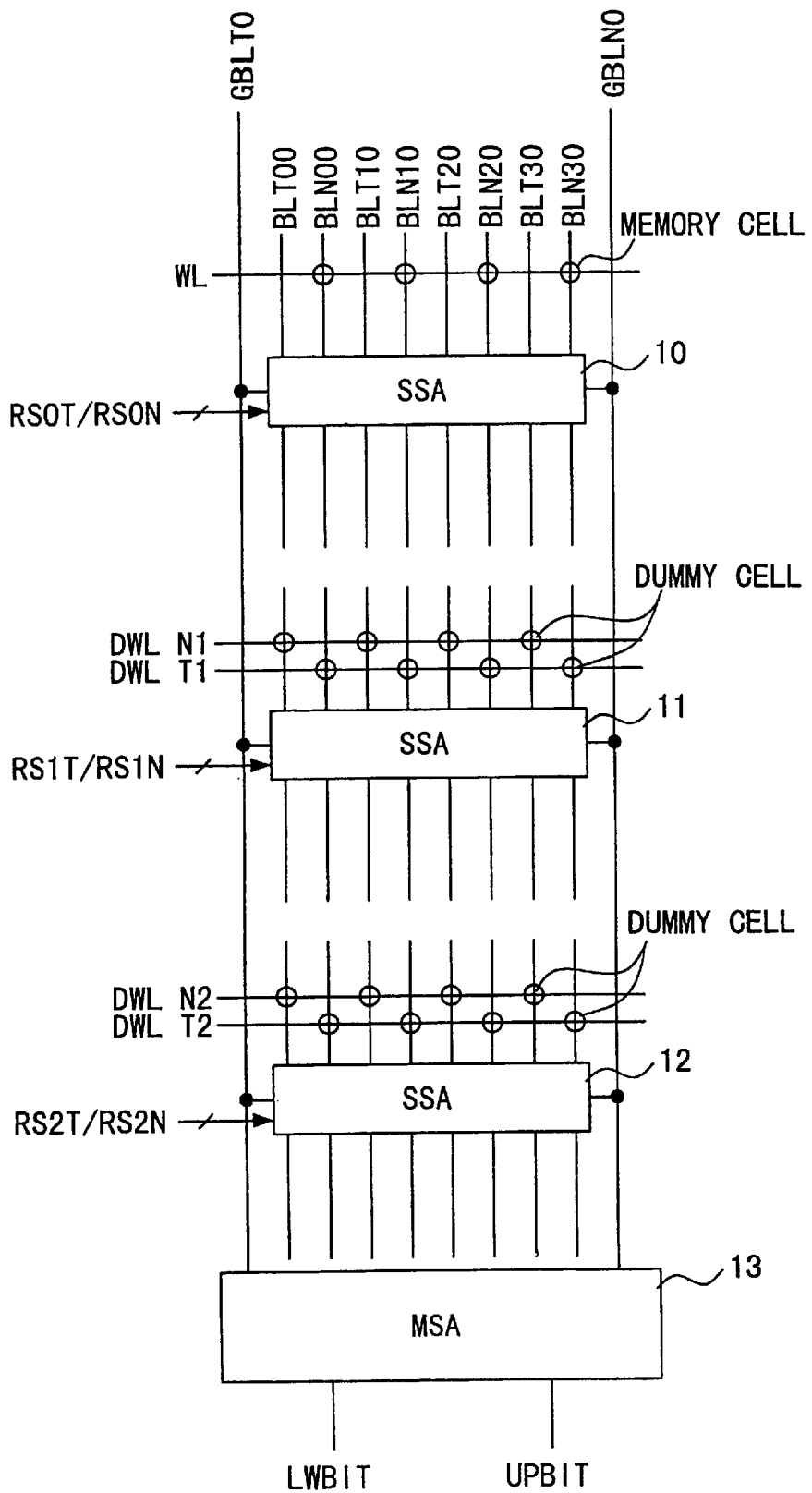
FIG. 1 is a block drawing showing the structure of the essential elements of a DRAM according to the first embodiment of the present invention.

FIG. 1 is a block diagram showing the structure of the essential elements of a DRAM according to the first embodiment, and like the first example of conventional art, is drawn by extracting only the parts related to the memory cell and sense amplifiers. For circuits other than those illustrated, circuits having the same functions as a circuits provided with a typical multi-value DRAM can be used. In addition, the memory cell array of the DRAM is formed by being partitioned into a plurality of sub-arrays, and in this figure, among the plurality of sub-arrays, only the three sub-arrays activated when carrying out the reading/writing of the memory cells included in specific sub-arrays are shown.

In the DRAM in each of the embodiments of the present invention, the example of a structure wherein a layered bit line structure is used, and it is assumed that one pair of complementary bit lines and 4 pairs of complementary sub-bit lines are treated as a unit. Metal wiring such as aluminum is used for the main bit lines, and silicide having a higher resistance is used for the sub-bit lines. In addition, sense amplifiers are formed by main sense amplifiers (abbreviated hereinbelow "MSA") and sub-sense amplifiers (abbreviated hereinbelow "SSA"), so as to correspond to the structure of the bit lines. A number of the MSAs and SSAs are present that, like the sub-arrays, are not illustrated, and in the 4-value DRAM, reading/writing is carried out using one MSA and three SSAs as a unit, and thus, only three sub-arrays are illustrated, as explained above.

As will be explained below in more detail, the reference symbol WL denotes a word line, and in FIG. 1 only one line is shown in order to simplify the illustration. Actually, about 64 to 512 word lines are printed for one sub-array. Next, reference symbols GBLT0 and GBLN0 are main bit lines, and reference symbols BLTx0 and BLNx0 (x=0 to 3) are sub-bit lines. In the present embodiment, for one main bit line pair, four sub-bit line pairs are provided, and for these sub-bit lines, the SSAs and the MSAs are shared. Moreover, like the main bit lines GBLT0 and GBLN0, the difference between the two the signal names is only the "T" and the "N", which means that both the signals are mutually complementary (True/Not). Originally, as shown in each type of timing chart that will appear later, we note that mutually complementary the signals do not always necessarily have a True/Not relationship. In addition, in the following explanation, four sub-bit lines BLTx0 (x=0 to 3) are generically simply called "BLTx0".

Next, at the intersection between the word line WL and the four sub-bit lines BLNx0, memory cells (shown as "o" in the figure) similar to those provided on a typical multi-value DRAM are disposed. Here, assuming that the internal power supply potential used inside the DRAM is VCC, the potentials corresponding to the four-value data 11, 10, 01, and 00 held in the memory cell are respectively O, (⅓)VCC, (⅔)VCC, and VCC (please also refer to FIG. 2A). Moreover, in the present embodiment, the relationship between data and potential is the reverse of the normal relationship, but the data 11 can be made to correspond with the usual potential VCC by a person skilled in the art by appropriately modifying the circuits. In addition, in the following explanation, "(⅓) VCC" etc., are abbreviated ⅓ VCC, and similarly for other potentials.

Next, the SSA 10 senses the stored data in the memory cell connected to the word line WL, and at the same time generates a reference level for discriminating whether the stored data in the memory cell is 1x or 0x. Then the potentials corresponding to the reference level and stored data are output to the main bit lines GBLT0 and GBLN0 depending on the respective the signals RSOT and RSON. Next, reference symbols DWLN1, DWLT1, DWLN2, and DWLT2 are all dummy word lines, and at each crossing between a dummy word line and the sub-bit lines, a dummy cell (shown by "o" in the figure) is disposed. These dummy cells can use the exact same cells as the above-described memory cells, and each of the capacitance characteristics of the capacitor in the cells is identical to those of the memory cell. Here, entirely identical potentials are written to the dummy cells connected to identical dummy word lines, and contrariwise, mutually differing potentials are written to dummy cells connected to different dummy word lines. Specifically, 0, ⅓ VCC, ⅔ VCC, and VCC are respectively written to the dummy cells connected to dummy word lines DWLN1, DWLT1, DWLN2, and DWLT2.

In addition, the SSA 11 generates reference levels for discriminating whether the stored data in the memory cell is 01 or 11 based on the stored potential of the dummy cell pairs connected to dummy word lines DWLT1 and DWLN1, and outputs this to the main bit lines GBLT0 and GBLN0 according to the signals RS1T and RS1N. Similarly, the SSA 12 generates reference levels for discriminating whether the stored data in the memory cell is 01 or 11 based on the stored potential of the dummy cell pair connected to dummy word lines DWLT2 and DWLN2, and outputs this to the main bit lines GBLT0 and GBLN0 depending on the signals RS2T and RS2N. Moreover, the structures of each SSA from SSA 10 to SSA 12 are all identical, and determining which role among the SSA 10 to the SSA 12 each SSA will play depends on which sub-array each memory cell activated by the selected word line is in. In addition, the detailed structure of these SSAs will be explained below. Additionally, in the figure, while each dummy word line pair is provided with sets of four of dummy cell pairs, actually only a set of one of dummy cell pair is necessary. Thus, the remaining set of three dummy cell pairs can be used as dummy cell pairs (for redundancy) that substitute when a dummy cell pair used as the default is defective.

Next, the MSA 13 discriminates the value of the stored data in the memory cell based on the sense result of SSA 10 to SSA 12, and their upper bit UPBIT and the lower bit LWBIT are output independently. We note that the detailed structure of this MSA 13 is explained along with the detailed structure of the SSA.

Figure 3:
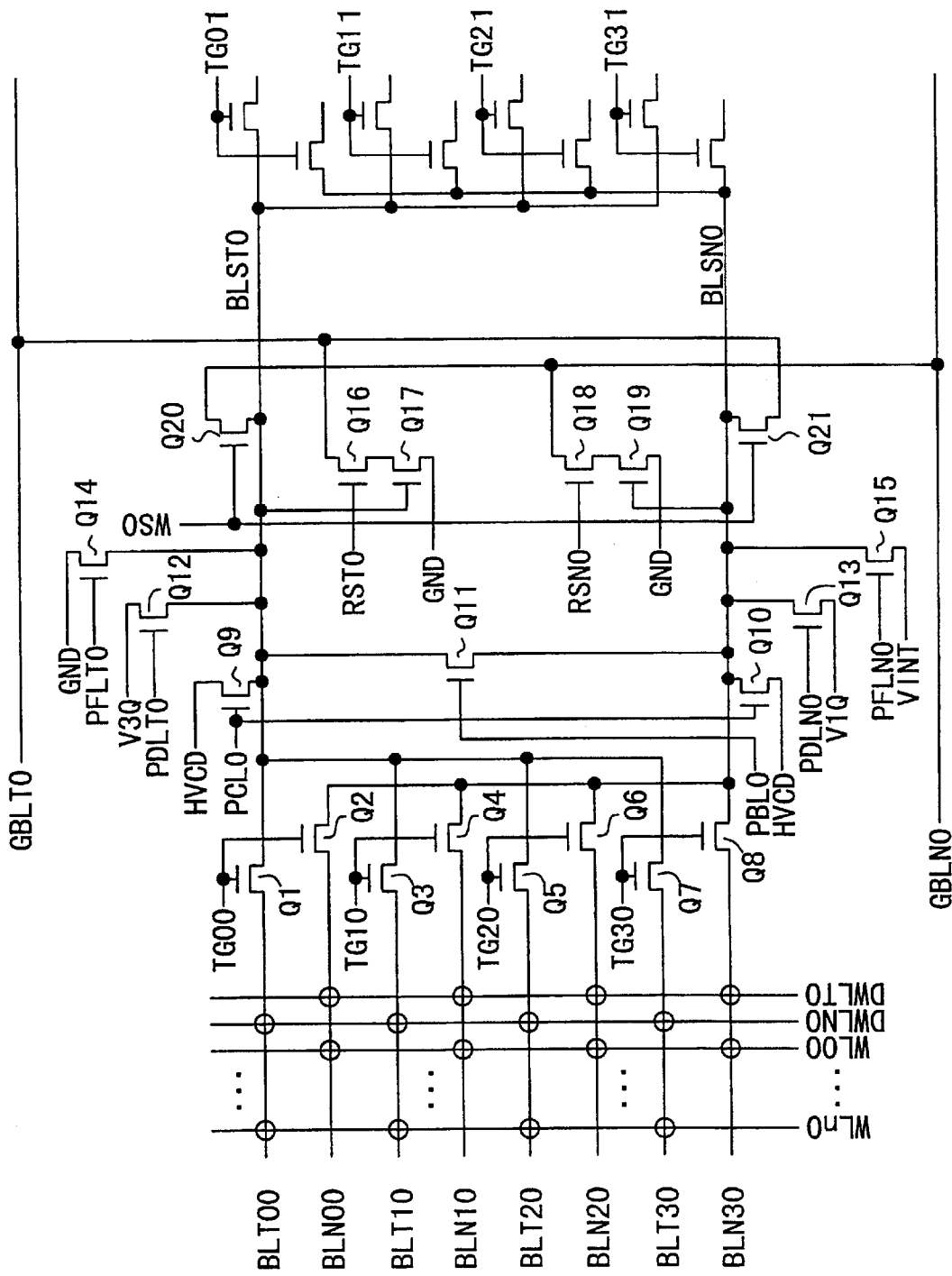
FIG. 3 is a circuit diagram showing an example of the structure of an SSA in the first embodiment of the present invention.

Moreover, in FIG. 1, in order to simplify the illustration, only the activated word line and the dummy word line are shown. That is, actually as shown in FIG. 3 below, a plurality of word lines and two dummy word lines are printed in each sub-array. Among these, in FIG. 1, only the word line WL is activated in the uppermost sub-array, only dummy word lines DWLN1 and DWLT1 are activated in the middle sub-array, and only dummy word lines DWLN2 and DWLT2 are activated in the lowest sub-array.

Here, referring to FIGS. 2A and 2B, the relationship between the potential held in the memory cell and dummy cell and the reference level for discriminating between data will be explained. In the figure, "Memory Cell" shows the potential corresponding to each data stored in the memory cell, "SBL" shows the potential on the sub-bit line, "GBL" shows the potential on the main bit line, and "Dummy Cell" shows the potential corresponding to each data written to and stored in the dummy cells. In further detail, in FIG. 2A relationship between the stored data in the memory cell and the potentials is as described above. In addition, when reading out from the memory cell on the sub-bit line, this potential falls in the range from just under ⅓ VCC to just over ⅔ VCC, as shown under "SBL". Furthermore, when reading out from the sub-bit line to the main bit line, as shown under "GBL", the potential falls in a range of about ⅙ VCC to ⅚ VCC.

Figure 2A:
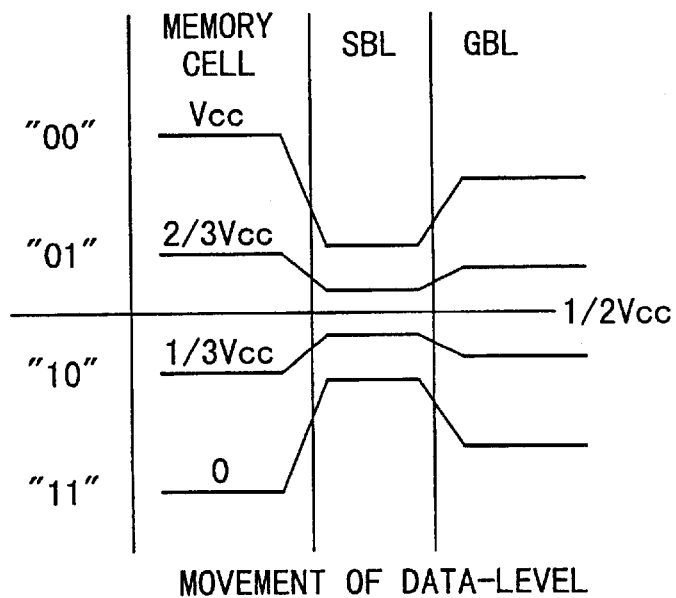
FIGS. 2A and 2B are drawings showing the respective relationships between the potentials corresponding to the data held in the memory cell/dummy cell and the potentials on the sub-bit line and the main bit line.
Figure 2B:
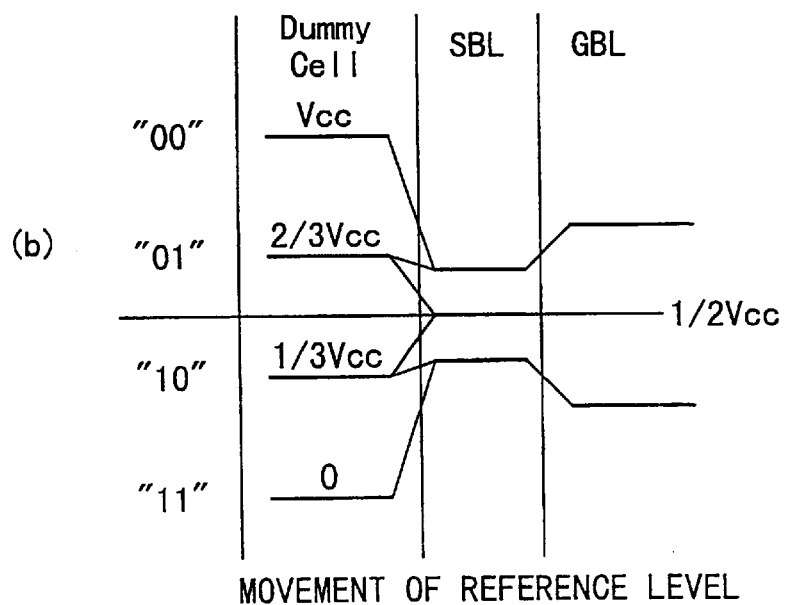

FIG. 2B shows the potentials when the reference level generated based on the potentials written to the dummy cells are read out sequentially on the sub-bit lines and on the main bit line, in the same sequence as FIG. 2A. In FIG. 2B, the relationship between the potentials written to the dummy cell and the data is as described above. In addition, among the data levels on the sub-bit line shown in FIG. 2A, reference levels on the sub-bit lines become close to the middle potential of the two adjacent levels. Similarly, among the data levels on the main bit lines shown in FIG. 2A, the reference levels on the main bit lines also become a potential close to the middle of the two adjacent levels. Moreover, as described below. sometimes the logical level inverts because of the sensing by the SSA, but FIGS. 2A and 2B do not take this point into consideration in order to simplify understanding.

Next, referring to FIG. 3, the detailed structure of an SSA will be explained. Moreover, in FIG. 3, essential elements that are the same as those shown in FIG. 1 have identical reference numerals and symbols. In addition, as described above, in FIG. 1, only the activated word lines and dummy word lines are shown, but in FIG. 3, (n+1) word lines WL 00 to WL n0 (where n is a natural number) and two dummy word lines DWLT0 and DWLN0 that are printed in each SSA are illustrated. Moreover, dummy word line DWLN0 corresponds to the signals DWLN1 and DWLN2 in FIG. 1, and dummy word line DWLT0 corresponds to the signals DWLT1 and DWLT2 in FIG. 1. In addition, the signal RST0 corresponds to the signal RSxT (x=0 to 2) in FIG. 1, while the signal RSN0 corresponds to the signal RSxN (x=0 to 2) in FIG. 1.

Next, the signal TGx0 (x=0 to 3) is a signal for linking the signal lines BLST0 and BLSN0 by selecting one of the four pairs of sub-bit lines BLTx0 and BLNx0. In order to accomplish this, TrQ1 and TrQ2 set the signal TG 00 at H level, and thereby the pairs of sub-bit lines BLT00 and BLN00 are connected to respective the signal lines BLST0 and BLSN0. Moreover, including TrQ1 and TrQ2, all of the transistors, to the extent that they are not specified, are n-channel MOSFETs (metal oxide silicate field effect transistors). TrQ10 and TG 20 have the same functions as TrQ1 and TrQ2, and by setting the signals TG10 and TG30 respectively at H level, the respective corresponding sub-bit line pairs are connected with the signal lines BLST0 and BLSN0. Moreover, in the SSA10, by setting one among the signals TGx0 at H level, four sub-bit line pairs are switched by time division. Contrariwise, in the SSA112 and the SSA12, one of the bit line pairs connected to a non-defective dummy cell is selected by activating one of the signals TGx0.

Next, when BLST0 and BLSN0 have been precharged to ½ VCC, the signal PCL0 is activated in order to make the potential of these signal lines fall immediately to ½ VCC. This means that when the signal PCL0 is set at H, TrQ9 and TrQ10 are turned ON, and thereby the signal HVCD is connected to the signal lines BLST0 and BLSN0. The potential of this signal HVCD is ½ VCC, and supplied from a pseudo-power source circuit (not illustrated) provided inside the DRAM. Moreover, the output of the pseudo-power source circuit that generates the signal HVCD is connected to the counter electrode (that is, the terminal on the side opposite to that connected to the cell transistor) of the capacitor that forms the memory cells, and this plays the role of stabilizing this pseudo-power source circuit. Next, TrQ11 is for balancing the potentials on the signal lines by shorting the signal lines BLST0 and BLSN0 by TrQ11 setting the signal PBL0 at H level.

Moreover, the present embodiment differs from the typical DRAM because it is not the case that in the standby state, the sub-bit line is precharged to ½ VCC, which then becomes as-is the reference level. Instead, in the present embodiment, as will be described in detail below, the sub-bit lines BLTx0 and BLNx0 are respectively charged beforehand to potentials V3Q (=⅔ VCC) and V1Q (=⅓ VCC), and by balancing these potentials, potential ½ VCC is produced. The reason for doing this is that because the output of the power source circuit that generates the internal power source potential is connected to various circuit elements in the DRAM, these circuit elements contribute to stabilizing the relevant power source circuits.

However, because potential V3Q and potential V1Q are used only to write to the memory cells and the dummy cells, unlike the internal power source potentials, etc., in the DRAM there is no part that contributes to stabilization. Thus, it can be assumed that this is the cause of the potentials becoming reduced during writing. In order to avoid this type of condition, the amplifier that forms the pseudo-power source can itself be made to have large capacity, but in this case there is the problem that the circuit scale of the chip becomes large. Thus, in the present embodiment, the pseudo-power source is stabilized by the parts that are operated by the potentials V3Q and V1Q in the DRAM being made as numerous as possible, and unused sub-bit line pairs in the standby state are charged beforehand by potentials V3Q and V1Q.

Next, TrQ12 supplies the potential of the signal V3Q to the signal line BLST0 when the signal PDLT0 is at H level, and the potential of ⅔ VCC is supplied from the pseudo-power source (not illustrated) to the signal V3Q. In addition, TrQ13 supplies the potential of the signal V1Q to the signal line BLSN0 when the signal PDLN0 is at H level, and the potential of ⅓ VCC is supplied from the pseudo-power source (not illustrated) to the signal V1Q. Similarly, TrQ14 and TrQ15 supply the potentials of the signals GND and VINT to respective the signal lines BLST0 and BLSN0 when the signals PFLT0 and PFLN0 are at H level. Here, the potential of the signal GND is at ground level. In addition, the potential of the signal VINT is the power source potential VCC, and this power source potential VCC is generated by an internal power source circuit (not illustrated) based on the external power source potential supplied from outside the DRAM. Moreover, the type of timing at which these signals PDLN0, PDLT0, PFLN0, and PFLT0 are activated, etc., is described in detail in the explanation of the operation.

Next, TrQ16 is activated by the above-described the signal RST0, and via TrQ17, whose source terminal is grounded, the potential of the signal line BLST0 is reverse amplified and transmitted to the main bit line GBLT0. Similarly, TrQ18 is activated by the above-described the signal RSN0, and via TrQ19, whose source terminal is grounded, the potential of the signal line BLSN0 is reverse amplified and transmitted to the main bit line GBLN0. That is, TrQ17 and TrQ19 are sensing transistors that sense the difference between the levels of the signal lines BLST0 and BLSN0 and output the difference to the main bit line. Next, TrQ20 transmits the potential on main bit line GBLN0 to the signal line BLST0 when the signal WS0 is activated during writing to the memory cell. Similarly, TrQ21 transmits the potential on the main bit line GBLT0 to the signal line BLSN0 when the signal WS0 is activated. We note that the writing path to the memory cell has a True/Not relationship the inverse to that of the reading path because the relationship between the data stored in the memory cell and the potential as described above is reverse that of the typical relationship.

Moreover, in FIG. 3, in order to show that the sub-bit lines are connected to both sides of the SSA, four transistor pairs are shown in the right end part of the figure in which the signals TGx1 (x=0 to 3), the same type as the signals TGx0, are connected to the gate terminals. In addition, like the sub-bit lines BLTx0 and BLNx0, in sub-bit lines connected to these transistor pairs (not illustrated) as well, (n+1) word lines and two dummy word lines are printed so as to intersect.

Figure 4:
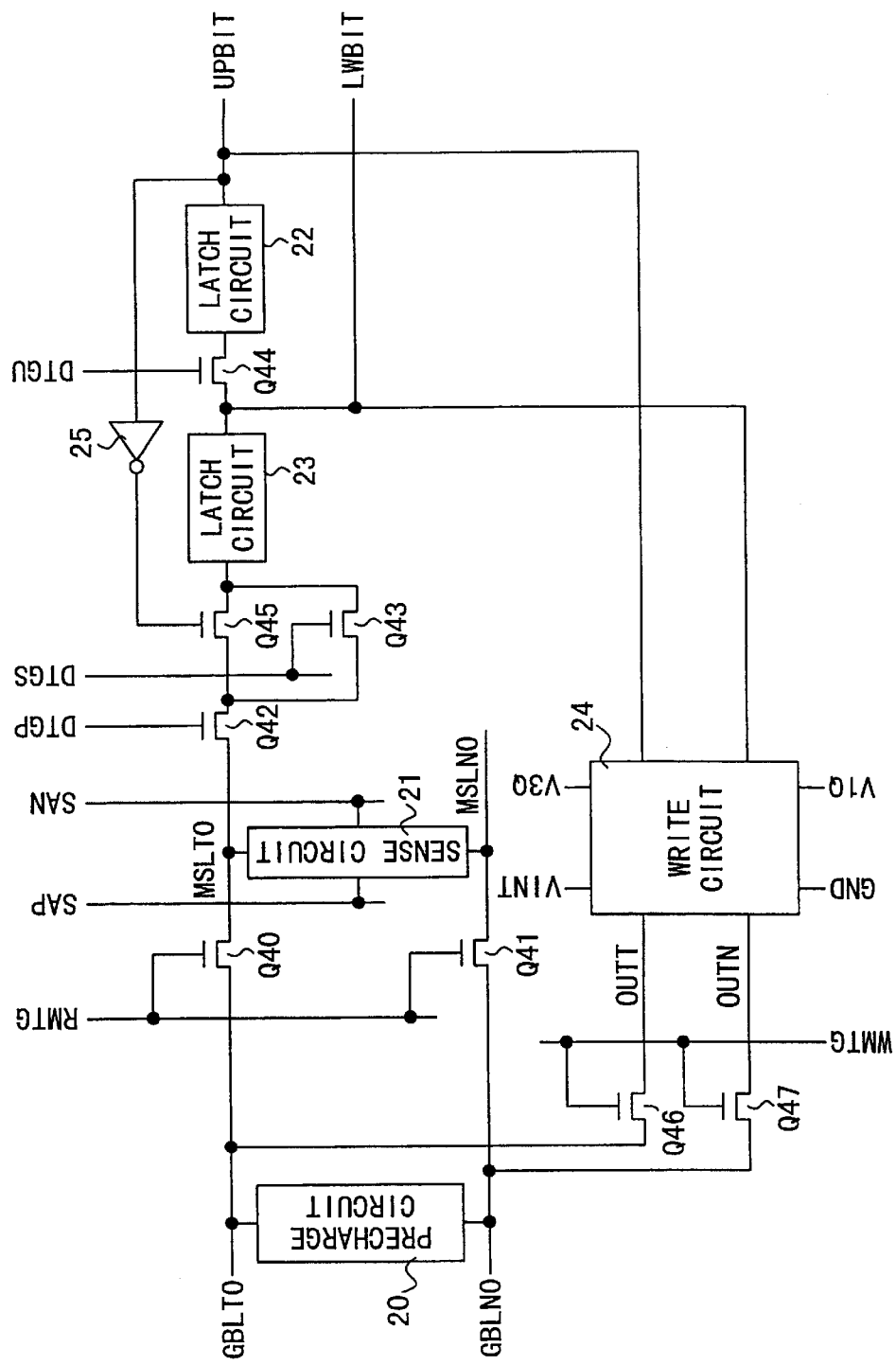
FIG. 4 is a circuit diagram showing an example of the structure of an MSA in the same embodiment.

Next, referring to FIG. 4, the detailed structure of the MSA will be explained. Moreover, the essential components that are the same as those shown in FIG. 1 to FIG. 3 have identical reference numerals and symbols. In FIG. 4, the precharge circuit 20 is a general circuit for precharging both main bit lines GBLT0 and GBLN0 to ½ VCC. Next, to sense the main bit lines GBLT0 and GBLN0, TrQ40 and TrQ41 respectively connect the main bit lines GBLT0 and GBLN0 to the signal lines MSLT0 and MSLN0 when the signal RMTG is inverted to H level. In addition, sense circuit 21 is similar to a sense amplifier used in a typical DRAM, and depending on the signals SAP and SAN, senses the potential of the main bit lines GBLT0 and GBLN0 that has been transmitted to the signal lines MSLT0 ad MSLN0, and outputs H level or L level. Moreover, the signal SAP and SAN are sense amplifier activation the signals, and activate each of the P-channel and N-channel transistors that form respective sense amplifiers.

Next, the latch circuits 22 and 23 respectively hold the upper and lower bit of the data in the memory cell obtained by the sensing of the sense circuit 21. Here, in this embodiment, the data in the memory cells is sensed in three stages: upper bit, lower bit when the upper bit=1, and the lower bit when the upper bit=0. Thus, TrQ42 to TrQ44 are controlled by changing the signals DTPG, DTGS, and DTGU at specified timing cycles (refer to the explanation of the operation for details), and at the same time the conductive state of TrQ45 is controlled by a signal that is the output of the latch circuit 22 inverted by the inverter 25. Thereby, the upper and lower bits are respectively loaded into latches 22 and 23.

Next, the write circuit 24 is a circuit that generates a write potential when rewriting is carried out in the write or read process to the memory cell, and outputs a potential depending on the data held in latch circuits 22 and 23. Specifically, for the potential of output terminal OUTN, when the stored data in the latches 22 and 23 is 00, the potential is GND (=0); when the stored data in latches 22 and 23 is 01, the potential is V1Q (=⅓ VCC); when it is 10, the potential is V3Q (=⅔ VCC); and when it is 11, the potential is VINT (=VCC). In contrast, the potential of the output terminal OUTT is the inverse thereof: depending on the data 00, 01, 10, 11, the corresponding potentials VINT, V3Q, V1Q, and GND are respectively generated. Moreover, to realize the write circuit 24, for example, UPBIT and LWBIT are decoded, and based on the result of this decoding, one out of the four types of these potentials can be selected.

Next, in writing to the memory cell, TrQ46 and TrQ47 transmit respectively to the main bit lines GBLT0 and GBLN0 the potentials of the output terminals OUTT and OUTN of write circuit 24 when the signal WMTG inverts to H level. Moreover, as described below, writing to memory cells is carried out from the output terminal OUTT via the main bit line GBLT0. In addition, the sum of the potentials of the output terminals OUTT and OUTN becomes VCC, irrespective of the stored data in the latch circuits 22 and 23. Thus, after these potentials are provided to the main bit lines GBLT0 and GBLN0 and written, if both potentials balance, ½ VCC can be generated.

Moreover, among the signals supplied to the above described MSA and SSA, signals VINT, V1Q, V3Q, OND, and HVCD are supplied from the internal power supply circuit or the pseudo-power supply circuit, as described above. In contrast, like the typical DRAM, the word lines WL00 to WLn0 are driven by the output of a row decoder (not illustrated), and in addition, the main bit line is connected to a column decoder via a column switch (not illustrated). Additionally, all other the signals are supplied from a controller (not illustrated) provided in the DRAM.

Next, the operation of the DRAM according to the above-described structure will be explained, and first carrying out reading from the memory cells will be explained.

(1) The Read Operation

As described above, in the present embodiment, the discrimination is carried out in the sequence: upper bit, the lower bit when the upper bit=1, and the lower bit when the upper bit=0. At this time, a reference level for discriminating the upper bit is generated in the SSA10 (refer to FIG. 1), and a reference level for discriminating the lower bit is generated by balancing the potentials in two types of dummy cells respectively connected to the SSA11 and the SSA 12. Moreover, below, it is assumed that the pairs of dummy cells connected to sub-bit line pairs BLTx0 serve as defaults, and all of the dummy cells are non-defective.

Figure 5:
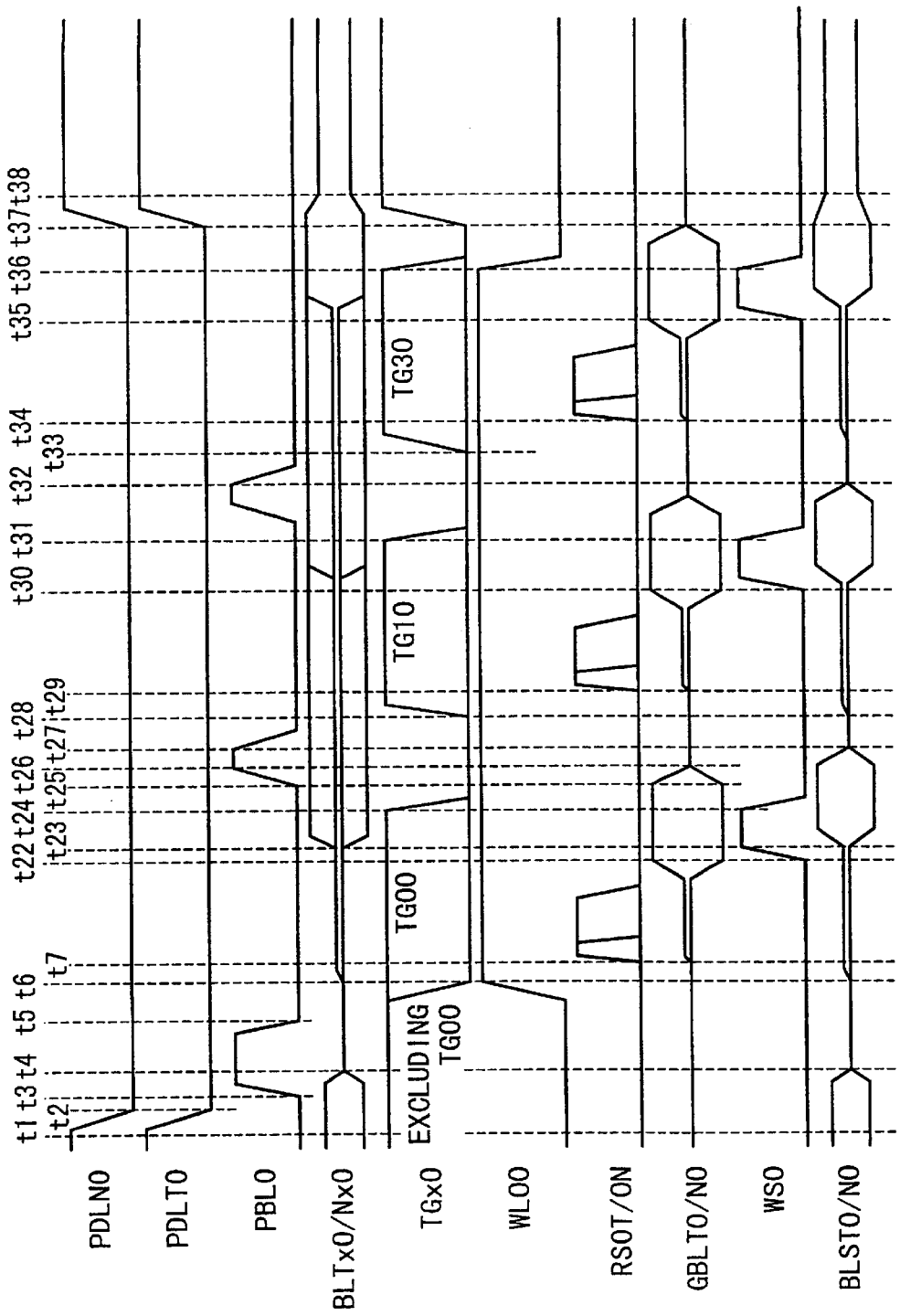
FIG. 5 is a timing chart showing the operation of the SSA included in the sub-array of the activated word line, among SSAs in the same embodiment.
Figure 6:
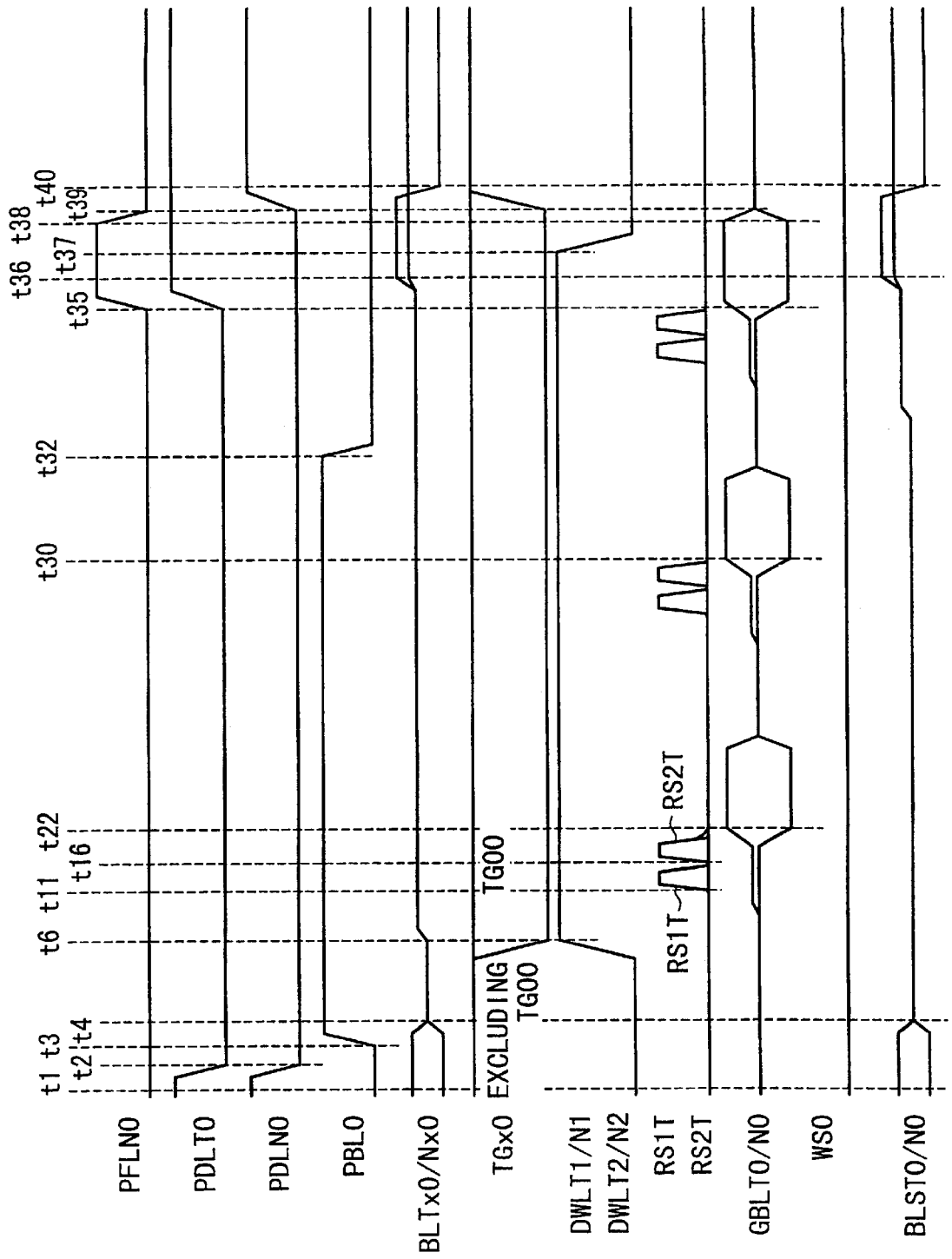
FIG. 6 is a timing chart showing the operation of the SSA included in the sub array of the activated word line, among SSAs in the same embodiment.
Figure 7:
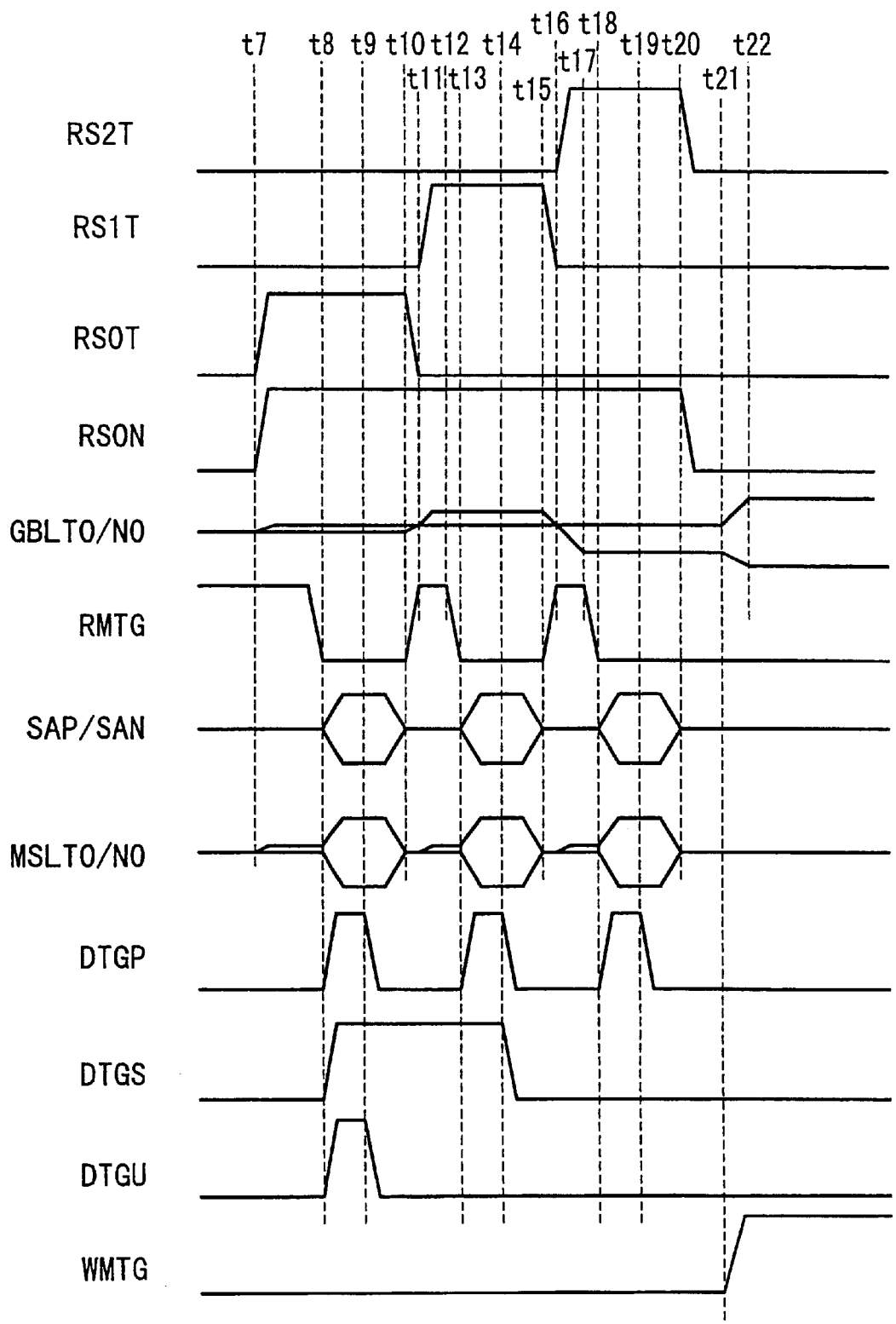
FIG. 7 is a timing chart showing the operation of the MSA in the same embodiment.

FIG. 5 shows the operation timing of the SSA10 shown in FIG. 1, and FIG. 6 shows the operation timings of the SSA11 and the SSA12. In addition, FIG. 7 shows mainly the operation timing of the MSA 13. The intervals shown in these figures correspond to the times t7 to t22 in FIG. 5. Moreover, in the scope related to the following explanation, in sub-arrays other than those shown in FIG. 1, the word lines and dummy word lines are not activated, and thus operations in sub-arrays other than those illustrated are not specifically mentioned.

First, in the initialization processing after turning on the power source, the potentials 0, ⅓ VCC, ⅔ VCC, and VCC are written beforehand in each of the four dummy cells connected to dummy word lines DWLN1, DWLT1, DWLN2, and DWLT2 shown in FIG. 1. Moreover, as described below, the writing to dummy cells is carried out during the processes of the reading operation (rewriting operation) as well, and the writing to dummy cells during the initialization processing can be carried out in exactly the same way as the writing to the dummy cell. Therefore, this will not be explained in detail.

① Standby State

Next, in the standby state up to time t1, both the signals PDLN0 and PDLT0 supplied to the SSA10 to the SSA12 are set at H level. Thereby, in these SSAs, the signal lines BLST0 and BLSN0 are respectively precharged to potential V3Q (=⅔ VCC) and potential V1Q (=⅓ VCC). In addition, in the standby state, all the signals TGx0 are set at H level, so there is a state in which all the sub-bit line pairs are selected. Thereby, because TrQ1 to TrQ8 shown in FIG. 3 are all turned ON, the True-side sub-bit lines (BLTx0) are all precharged to ⅔ VCC, and the Not-side (BLNx0) are all precharged to ⅓ VCC. Contrariwise, in the standby state, in the MSA13, the precharge circuit 20 precharges both main bit lines GBLT0 and GBLN0 to ½ VCC.

② Setting the Reference Levels

Next, at time t2, the signals PDLN0 and PDLT0 are both restored to L level. Next, as a result of decoding the read address given by the DRAM, if the memory cell on the word line shown in FIG. 1 is selected, at time t3 the signal PBL0 rises. When this signal PBL0 rises sufficiently to invert to H level, TrQ11 is turned ON, both potentials on the signal lines BLST0 and BLSN0 are balanced, and at time t4 the potentials of the signal lines BLST0 and BLSN0 and the sub-bit lines BLTx0 and BLNx0 all become ½ VCC. Moreover, although not specifically shown in the timing charts for FIG. 5 to FIG. 7, the signal PCL0 is activated in each SSA accompanying the activation of the signal line BLST0. Thereby, the signal lines BLST0 and BLSN0 and sub-bit lines BLTx0 and BLNx0 are connected by the signal HVCD, and the potentials of these signal lines settle to ½ VCC.

Next, in the SSA10, at time t5 lines BLST0 and BLSN0 are cut off from each other by restoring the signal PGLO to L level. As will be explained later, this is in order to read out the main bit lines GBLT0 and GBLN0 separately from the signal lines BLST0 and BLSN0 to discriminate the upper bit of the stored data of the cell memory using potential ½ VCC on sub-bit line BLTx0 as a reference level. Next, at time t6, in each of the SSA10 to the SSA12, among the signals TGx0, only the signal TG00 is maintained at H level, while the other the signals are set at L level. At this time, simultaneously the signal line WL (corresponding to the word line WL00 in FIG. 3) is raised, and in addition, dummy word lines DWLT1, DWLN1, DWLT2, and DWLN2 are all raised. In addition, at this time, in each of the SSA10 to the SSA12, the signals TGx1 (x=0 to 3) are all set at L level, and the sub-bit line pairs on the non-selected side are cut off from each SSA.

By each of the above operations, in the SSA10, the charge accumulated in the memory cell connected to the word line WL00 is read out on the sub-bit line BLNx0, and acquires potentials (refer to "SBL" in FIG. 2A) depending on stored data in the memory cells connected to each of the sub-bit lines. Additionally, among these, the potential on the sub-bit line BLN00 is transmitted to the signal line BLSN0 via TrQ2 that has been activated by the signal TG00. At this time, the potential of the signal line BLST0 via sub-bit line BLT00 and TrQ1 remains at ½ VCC, which it had during the precharge. Moreover, this potential corresponds to the reference level for discriminating data 1x and data 0x.

On the one hand, in the SSA11, the potential corresponding to potential 0 held in the dummy cell connected to dummy line DWLN1 arrives on sub-bit line BLTx0, and at the same time, the potential corresponding the potential ⅓ VCC held in the dummy cell connected to dummy word line DWLT1 arrives on sub-bit line BLNx0. The potentials on these sub-bit lines are the same as the potentials of the data levels shown under "SBL" in FIG. 2A. We note that, at this point in time, in the SSA11 and the SSA12, the signal PBL0 remains at H level, and TrQ11 is in an ON state, and thus, the potentials transmitted via TrQ1 and TrQ2 to the signal lines BLST0 and BLSN0 from sub-bit lines BLT00 and BLN00 are balanced. Thus, the potentials of these signal lines BLST0 and BLSN0 become the reference levels for discriminating data 10 and data 11. This level is the potential corresponding to ⅙ VCC, which is the potential positioned at the bottom of ½ VCC among the potentials shown in "SBL" in FIG. 2B.

On the other hand, at the SSA12, the same operation as that of the SSA11 takes place. That is, the potential corresponding to potential ⅔ VCC held in the dummy cell connected to dummy word line DWLN2 arrives on sub-bit line BLT00, and the potential corresponding to potential VCC held in the dummy cell connected to the dummy word line DWLT2 arrives on the sub-bit line BLN00. Additionally, the potentials in these sub-bit line pairs are respectively transmitted to the signal lines BLST0 and BLSN0 and mutually balanced, and as a result the potential on the signal lines BLST0 and BLSN0 take on the reference levels for discriminating data 00 and data 01. This level is the potential corresponding to ⅚ VCC, and is the potential positioned above ½ VCC among the potentials shown under "SBL" in FIG. 2B.

③ Sensing the Upper Bit

Next, the operation described below is carried out in order to transfer the result of the sensing by the SSA10 to the MSA13 and discriminate the upper bit. First, at time t7, as shown in FIG. 7, in the SSA10 both the signals RSOT and RSON (corresponding to the signals RST0 and RSN0 in FIG. 3) rise. As a result, in the SSA10, TrQ16 and TrQ18 are turned ON, and the potential corresponding to the potential ½ VCC of the signal line BLST0 arrives on the main bit line GBLT0 via TrQ17 and TrQ16 (refer to ½ VCC shown under "GBL" in FIG. 2B).

At the same time, the potential corresponding to the stored data in the memory cell read out on the signal line BLSN0 arrives on the main bit line GBLN0 (refer to the potential shown under "GBL" in FIG. 2A) via TrQ19 and TrQ18. Moreover, due to this type of sensing operation of the SSA10, the relationship of the data between the main bit lines GBLT0 and GBLN0 to the reference level is the inverse of the relationship in the signal lines BLST0 and BLSN0. In addition, at this time, in the MSA13, as shown in FIG. 7, the signal RMTG is set at H level, and thus the potentials of the main bit lines GBLT0 and GBLN0 are transmitted as they are to the signal lines MSLT0 and MSLN0 via TrQ40 and TrQ41.

Next, in the MSA13, the signal RMTG is reduced and at time t8 is set at L level, and thereby the main bit lines GBLT0 and GBLN0 are respectively cut off from the signal lines MSLT0 and MSLN0. At this time, simultaneously the sensing operation in sensing circuit 21 begins by activating the signals SAP and SAN, and the difference in level between sense lines MSLT0 and MSLT0 sent from the main bit lines GBLT0 and GBLN0 is sensed. As a result, if the upper bit of the stored data in the memory cell is 0, because the potential corresponding thereto becomes higher than reference level ½ VCC, the signal line MSLT0 attains an H level. In contrast, if this bit is 1, because the potential corresponding thereto is lower than reference level ½ VCC, the signal line MSLT0 attains an H level. In addition, at this time, in the MSA13, because all the signals DTGP, DTGS, and DTGU have been raised, the level of the signal line MSLT0 is loaded once into the latch circuit 23 via TrQ43 and TrQ43, and then via TrQ44, is loaded into latch circuit 22, and becomes the upper bit UPBIT. Subsequently, at time 9, the signal DTGP is reduced to be restored once to L level, and at the same time, the signal DTGU is set at L level, and the content of the latch circuit 22 is not changed during sensing of the lower bit.

④ Sensing the Lower Bit when the Upper Bit=1

Next, at time t10, in the MSA13, the signals SAP and SAN are inactivated, and at the same time, by raising the signal RMTG to H level, the main bit line GBLT0 is reconnected to the signal line MSLT0, and the main bit line GBLN0 is reconnected to the signal line MSLN0. In addition, at this time, in the SSA10, by reducing RSOT, the main bit line GBLT0 is cut off from the signal line BLST0. At the subsequent time t11, in the SSA11, the signal RS1T (the signal RST0 in FIG. 3) is reduced. As a result, in the SSA11, the potential of the signal line BLST0 arrives on the main bit line GBLT0 via TrQ17 and TrQ16. At this time, in the MSA13, at time t10, the potential of the reference level is transmitted to the signal line MSLT0 via TrQ40 because the signal RMTG is raised to H level. In contrast, similar to sensing the upper bit, the potential of the signal line MSLN0 becomes the potential on the main bit line depending on the data of the memory cell. Moreover, in this case as well, the relationship between the data and the reference levels is the inverse of the relationship between the signal lines BLST0 and BLSN0 and the main bit lines GBLT0 and GBLN0.

Next, at time t12, in the MSA13, the signal RMTG is reduced, and the main bit lines GBLT0 and GBLN0 are separated from the signal lines MSLT0 and MSLN0. Next, at time 13, in the MSA13, the signals SAP and SAN are activated, and depending on the difference in levels between the signal lines MSLT0 and MSLN0, the sense circuit 21 carries out the sensing operation. Thereby, if the potential corresponding to the stored data in the memory cell is lower than reference level of 10 or 11, the L level corresponding to the low bit is obtained between the signal lines MSLT0 and MSLN0. In contrast, if the potential corresponding to the stored data in the memory cell is higher than this reference level, the H level is obtained between the signal lines MSLT0 and MSLN0, the reverse of the previous case.

In addition, at this time, in the MSA13, because the signal DTGP rises to H level and the signal DTGS remains at H level, the potential of the signal line MSLT0 is loaded into latch circuit 23 via TrQ42 and TrQ43. Subsequently, at time 14, the signal DTGP is reduced once, and the signal DTGU is set at L level. In addition, at time t15, the signals SAP and SAN are inactivated. Moreover, in the case that the upper bit of the data in the memory cell is 0, the result of the sensing by the sense circuit 21 has no actual meaning, and the correct data is reset in the latch circuit 23 by the sense operation that is explained next.

⑤ Sensing the Lower bit when the Upper Bit=0

Next, at the same time t15, in the MSA13, the signal RMTG rises, and the main bit lines GBLT0 and GBLN0 are reconnected to the signal lines MSLT0 and MSLN0. In addition, at this time, in the SSA11, RS1T rises, and the main bit line GBLT0 is cut from the signal line BLST0. Next, at time t16, in the SSA12, as a result of the signal RS2T (corresponding to the signal RST0 in FIG. 3) rising, the potential of the signal line BLST0 (that is, the reference level for discriminating 00 and 01) arrives on the main bit line GBLT0. Moreover, in this case as well, the relationship between the data and the reference level is the inverse of the relationship between the signal lines BLST0 and BLSN0 and the main bit lines GBLT0 and GBLN0. In addition, at this time, in the MSA13, because the signal RMTG inverts to H, in the same manner as above, the potential of the main bit line GBLT0 is transmitted to the signal line MSLT0 via TrQ40, and at the same time, the potential of the signal line MSLN0 changes to the potential on the main bit line depending on the data in the memory cell.

Next, at time t17, in the MSA13, the signal RMTG rises, and the main bit lines GBLT0 and GBLN0 are cut off from the signal lines MSLT0 and MSLN0. Next, at time t18, the signals SAP and SAN are activated, and the sensing operation is carried out by the sense circuit 21 depending on the difference in levels between the signal lines MSLT0 and MSLN0. As a result, conforming to the case of sensing the lower bit when the upper bit=1, depending on whether the potential corresponding to the stored data in the memory cell is higher or lower than reference level of 00 and 01, levels H and L are respectively attained on the signal line MSLT0 depending on the lower bit.

In addition, at this time, in the MSA13, the signal DTGP rises to H level, and unlike the above case, the signal DTGS remains at L level. Thus, TrQ45 is turned on only when the output of latch circuit 22 is at L level (that is, when the upper bit of the memory cell is 0), and via TrQ45, the potential of the signal line MSLT0 is loaded into the latch circuit 23. Thus, because the lower bit in the memory cell is finally decided, the lower bit LWBIT can be output from the MSA13. Thus, subsequently, at time t19, after the signal DTGP is reduced, at time t20, the signals SAP and SAN are deactivated. In addition, at the same time t20, by respectively reducing the signals RS0N and RS2T, the main bit line GBLN0 is cut of from the signal line BLSN0 in the SSA10, and at the same time the main bit line GBLT0 is cut off from the signal line BLST0 in the SSA12.

⑥ Rewriting to the Memory Cell

Like a typical DRAM, in the DRAM according to each embodiment of the present invention as well, reading destroys data in the memory cell. Thus, the data of the memory cell output on the sub-bit line must be amplified by a sense amplifier and then written back into the memory cell. Furthermore, this is not limited to memory cells, but is the same for dummy cells. Thus, continuing the above-described reading, first the rewriting of the memory cell is carried out. Here, because data held in the memory cell at the point in time before reading has been loaded into latch circuits 22 and 23, rewriting is carried out based on this data.

This means that the writing circuit 24 in the MSA13 outputs VCC, ⅔ VCC, 0, and ⅓ VCC respectively to output terminal OUTT, which correspond to the data 00, 01, 10, and 11 output from the latch circuits 22 and 23. At this time, the write circuit 24 outputs the potential for which the sum of the output terminals OUTT and OUTN is VCC to the output terminal OUTN. Additionally, at subsequent time t21, in the MSA13, the signal WMTG rises, and the potential of the output terminal OUTT and OUTN of the write circuit 24 is supplied to the main bit lines GBLT0 and GBLN0 via TrQ46 and TrQ47.

Next, as shown in FIG. 5, at time t22, in the SSA10, when the signal WS0 rises, TrQ20 and TrQ21 are turned ON, and thus the main bit line GBLT0 is connected to the signal line BLSN0, and in addition, the main bit line BLN0 is connected to the signal line BLST0. Thereby, the write potential in the output terminal OUTT of the write circuit 24 is transmitted to the signal line BLSN0 via the main bit line GBLT0. As a result, at time t23, when the signal WS0 rises sufficiently to invert to H level, among the memory cells connected to the activated word line WL00, only for the memory cell tied to the sub-bit line BLN00 is the potential of the signal line BLSN0 rewritten via TrQ2.

Moreover, as shown in FIG. 6, at this time, in the SSA11 and the SSA12, because the signal WS0 is maintained at L level, no writing occurs in the dummy cells connected to dummy word lines DWLT1, DWLN1, DWLT2, and DWLN2. Additionally, at subsequent time t24, in the SSA10, the signal TG00 and the signal WS0 both rise, and the rewriting operation is completed. Thereby, the read operation of the memory cell connected to sub-bit line BLN00 is completed.

⑦ Reading Other Memory Cells

Subsequently, by making the signals TG10, TG20, and TG30 sequentially effective, the reading of each memory cell disposed at the intersections of the word line WL00 and the sub-bit lines BLN10, BLN20, and BLN30 is carried out in sequence by time division. This means that first, at time t25, in the SSA10, the signal PBL0 rises, and at the same time in the MSA13 the precharge circuit 20 carries out the precharging of the main bit lines GBLT0 and GBLN0. As a result, at time t26, both the main bit lines GBLT0 and GBLT0 are precharged to ½ VCC. In addition, as described above, the sum of the potentials supplied to the signal lines BLST0 and BLSN0 by the write circuit 24 via the main bit lines GBLN0 and GBLN0 is VCC, and thus the potentials on the signal lines BLST0 and BLSN0 are balanced, and at time 27, these signals are precharged to ½ VCC. Additionally, after waiting for the completion of the precharge operation, the signal PBL0 is reduced.

Next, at time t28, when the signal TG10 rises, the potential corresponding to the data in the memory cell connected to the sub-bit line BLN10 is read by the signal line BLSN0 via TrQ4. Thus, conforming to times t7 to t22, at times t29 to t30, three-stage sensing is carried out, and after the upper and lower bits of the data held in the memory cells is set in the respective latches 22 and 23 in the MSA13, according to the data in these latch circuits, the same potentials as those before reading are rewritten to the memory cells (times t30 to t32). Moreover, in this case, at time t31, instead of the signal TG00, the signal TG10 is reduced. Thereby, the reading of the memory cell connected to sub-bit line BLN10 is also completed.

Next, the signal TG20 is set at H level, and the reading of the memory cell connected to sub-bit line BLN20 is carried out, but since the operation in this case is exactly the same as when the signal TG10 is set at H level, this is omitted in FIG. 5.

Next, the operation in which the reading of the memory cell connected to the sub-bit line BLN30 by setting the signal TG30 to H level is fundamentally the same as activating the signals TG10 and TG20. That is, the operation of the SSA10 and the MSA13 during times t32 to t36 is the same as the operation during times t27 to t31 with the signal TG10. Here, each timing of times t3 to t35 in this interval respectively corresponds to each of the timings at times t28 to t30. Originally, the point that differs from the signals TG00 to TG20 is that along with completion of the rewriting, at time t36 the signal WS0 is reduced, and at the same time the word line WL00 is also reduced, and thus no further accesses to the memory cell are carried out. Additionally, at time t37 the signals PDLN0, PDLT0, and TGx0 all rise in order to return to the standby state. As a result, at the following time 38, the state is restored to that of time t1. In addition, the operation in the SSA11 and the SSA12 when the signal TG30 is opened by the SSA10 differs only partly from the operation when the signal TG10 or TG20 is opened in the SSA10. This means that in this case the rewriting to the dummy memory cell described below in detail is carried out.

⑧ Rewriting the Dummy Cell

First, as shown in FIG. 6, at time t32, in both the SSA11 and the SSA12, the signal PGL0 is reduced, and each of the SSA signal lines BLST0 and BLSN0 are cut off. Subsequently, at time t35, the following operations are carried out after the signal RST2 has been reduced accompanying the above-described completion of the sensing of a dummy cell. In the SSA12, the signal PDLT0 and the signal PFLN0 rise, the signal line BLST0 is connected to potential V3Q, and at the same time the signal line BLSN0 is connected to potential VINT. At this time, in the SSAl2, because the signal TG00 is maintained at H level, the potential VINT defined at time t36 is written to the dummy cell disposed at the intersection of the dummy word line DWLT2 and the sub-bit line BLN00. Similarly, the potential V3Q defined at the same time t36 is written to the dummy cell at the intersection of dummy word line DWLN2 and the sub-bit line BLT00.

In addition, although not illustrated in FIG. 6, an operation identical to that just described is being carried out in parallel in the SSA11. Specifically, at time t35, the signal PGLT0 and the signal PDLN0 rise together, and potential GND and potential V1Q defined at time t36 are respectively written to dummy dells connected to dummy word lines DWLN1 and DWLT1 via signal lines BLST0 and BLSN0.

Subsequently, at time t37, dummy word lines DWLT1, DWLN1, DWLT2, and DWLN2 are all reduced to L level. Next, at time t38, after the signal PFLN0 is reduced, at time t39, the signal PDLN0 rises, and at the same time the signals TGx0 other than signal TG00 all rise. As a result, at time t40, the sub-bit lines BLTx0 and the signal line BLST0 connected to the SSA11 and the SSA12 become potential V3Q, sub-bit lines BLNx0 and the signal line BLSN0 become potential V1Q, and are restored to the same state as the standby state they had up to time t1.

(2) The Writing Operation

Next, while the writing operation of the DRAM according to the above structure will be explained, the writing operation of a memory cell is basically the same as the rewriting operation in the above-described read process. Specifically, the data to be written is sent in advance to the MSA13 as an upper bit UPBIT and a lower bit LWBIT. In addition, by supplying a write address to the DRAM, depending on the result of decoding the write address, one word line among the word lines WL00 to WLn0 (refer to FIG. 3) is selected and activated, and at the same time by activating one of the signals TGx0 in the SSA10, the sub-bit line corresponding thereto is selected. Subsequently, in the MSA13, the signal WMTG is set at H level, and at the same time in the SSA10 the signal SW0 is set at H level. Thereby, via the main bit line GBLT0 and the signal BSLN0 in the SSA10, the potential generated by the write circuit 24 depending on the write data is written to the memory cell disposed at the intersection of the activated word line and the bit line on the Not-side of the selected sub-bit line pair.

As described above, in the present embodiment, typical word lines and memory cells can be used just like dummy word lines and dummy cells, and the feedback capacitors having special capacitance such as those in the first example of conventional art are completely unnecessary. Thus, the area can be made small, and the cost can be reduced. In addition, because there is no need to oscillate the word line potential as is the case in the second example of conventional art, compared to the SSA, there is no problem with the reduction of operating margins due to variance in the threshold voltages in the plurality of memory cells that causes the deterioration of the yield.

In addition, since the multi-value data stored in the memory cells and each of the reference levels are compared one by one, by providing only two main bit lines GBLT0 and GBLN0, irrespective of the numbers of the multi-value levels (4 values, 8 values, 16 values, etc.), the value of the multi-value data stored in the memory cells can be discriminated.

In addition, since the write potential of the memory cells and the dummy cells is generated by a pseudo-voltage source, the write time can be shortened in comparison to the conventional method wherein after carrying out respective writing in two sub-bit lines, they are balanced, and then final writing is carried out.

In addition, since the True/Not sub-bit lines in the standby state are respectively precharged to potentials V3Q and V1Q, this contributes to the stability of the pseudo-power source circuit for generating both of these potentials.

In addition, since three pairs of redundancy dummy cells are provided, in the SSA11 and the SSA12 one of the suitable the signals TGx0 is chosen, and thereby it is possible to switch to an arbitrary dummy cell pair provided for redundancy. Thus, even if a default dummy cell becomes defective or its holding characteristics deteriorate, these problems are resolved without decreasing reliability or yield.

Second Embodiment

In the above-described first embodiment, while three stages of sensing are carried out in order to read the multi-level data stored in a memory cell, theoretically, by providing three the MSAs for each of SSAs, reading with a one-stage sensing is possible. However, if this structure is implemented, not only does the printing of the main bit lines become physically problematic, the disposition of the MSAs also becomes troublesome. Thus, it is difficult to say that such a method can be realized. Therefore, in the present embodiment, the three-stage sensing carried out in the first embodiment is reduced to two-stage sensing, and the operation time can be reduced without making the structure excessively complicated.

Figure 8:
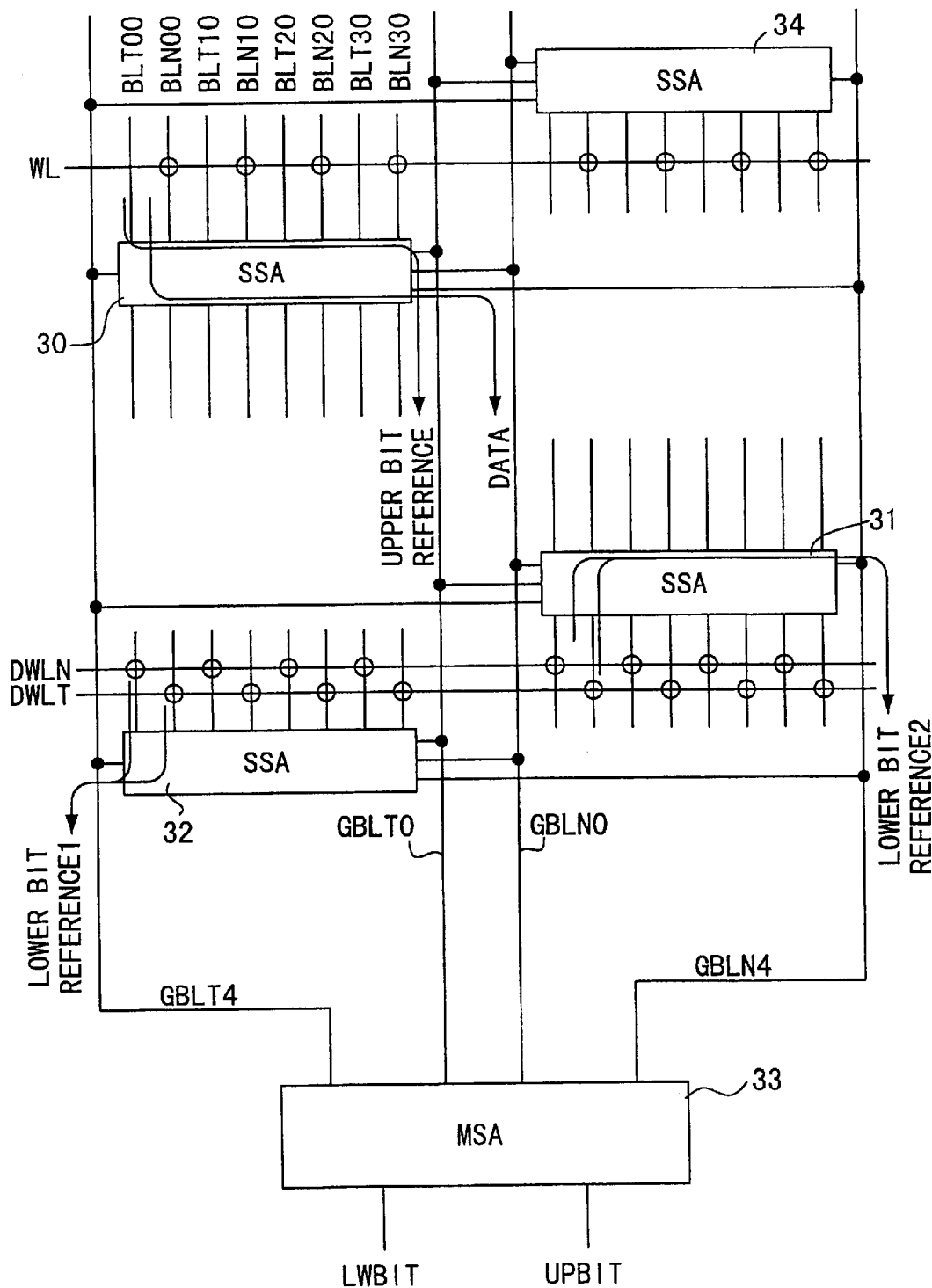
FIG. 8 is a block diagram showing the structure of the essential elements of the DRAM according to the second embodiment of the present invention.

FIG. 8 is a block diagram showing the structure of the essential elements of the DRAM according to the present embodiment, and structures that are identical to those shown in FIG. 1 (the first embodiment) have identical reference symbols. As shown in the figure, in the present embodiment, the four SSAs that are respectively included in four sub-arrays share one MSA. Here, the SSA30 to SSA32, and the MSA33 have functions similar to the SSA10 to SSA12, and the MSA13 explained in the first embodiment. In addition, the SSA30 to SSA32 and the SSA34 have structures that are completely identical to those of the first embodiment, and in addition, the roles (functions) played by the SSA30 and the SSA34 are the same. Moreover, because the SSA30 and the SSA34 share a main bit line, when the MSA33 carries out reading of a memory cell by using the SSA30 and the SSA34, reading is not carried out simultaneously by using these SSAs, but the reading is carried out from each of SSAs by time division.

Next, reference symbols GBLT0, GBLN0, GLBT4, and GBLN4 are all main bit lines. Among these, the potential corresponding to the data of the memory cell is loaded on the main bit line GBLN0, and the reference level (to discriminate 0x and 1x) corresponding to ½ VCC is loaded into the main bit line GBLT0. This is identical to the first embodiment. In contrast, the reference level (for distinguishing 00 and 11) corresponding to ⅙ VCC is loaded on to the main bit line GBLN4, and the reference level (for discriminating 00 and 01) corresponding to ⅚ VCC is loaded on the main bit line GBLT4. In addition, the word line WL is identical to that in the first embodiment, and within the scope shown in FIG. 8, the eight memory cells included in the two sub-arrays are activated simultaneously by the word line WL.

In the same manner, the dummy word lines DWLT and DWLN respectively drive the dummy cells to which they are connected. Among these, the potential GND (=0) is written to the dummy cell disposed at the intersection of the dummy word line DWLN and the sub-bit line connected to the SSA31, and the potential V3Q (=⅔ VCC) is written to the dummy cell disposed at the intersection of the same dummy word line and the sub-bit line connected to the SSA32. In addition, the potential V1Q (=⅓ VCC) is written to the dummy cell disposed at the intersection of the dummy word line DWLT and the sub-bit line connected to the SSA31, and the potential VCC (VINT) is written to the dummy cell disposed at the intersection of the same dummy word line and the sub-bit line connected to the SSA32.

Figure 9:
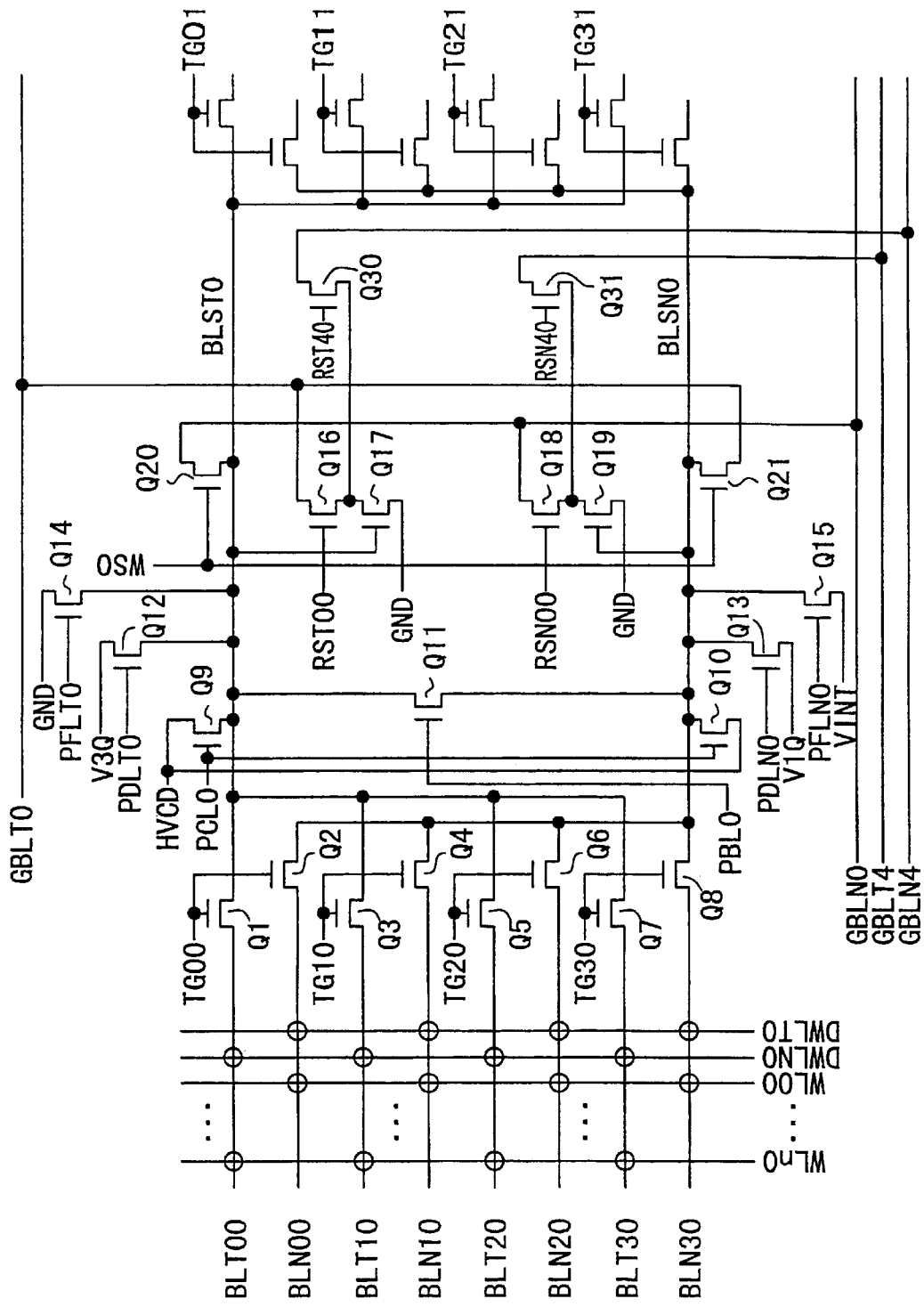
FIG. 9 is a circuit diagram showing an example of the structure of the SSA in the same embodiment.

Next, referring to FIG. 9, the concrete structure of the SSA30 to the SSA32 and DDS34 will be explained. Moreover, in the figure, essential components that are identical to those shown in FIG. 3 and FIG. 8 have identical reference symbols. Below, only the parts that differ from those of the first embodiment will be explained. In the SSA of the present embodiment, in addition to the main bit lines GBLT0 and GBLN0, because the main bit lines GBLT4 and GBLN4 are connected, TrQ30 and TrQ31 are added to the SSA in the first embodiment. TrQ30 has function similar to that of TrQ16, and when the signal RST40, which is a lead switch, inverts to H level, the potential on the signal line BLST0 is reverse amplified, and transmitted to the main bit line GBLN4. Similarly, TrQ31 has a function similar to that of TrQ18, and when the signal RSN40, which is a lead switch, inverts to H level, the potential on the signal line BLSN0 is reverse amplified, and transmitted to the main bit line GBLT4. Moreover, in the first embodiment, the signal RST0 and RSN0 are provided to the gates of TrQ16 and TrQ18, but for convenience of explanation, in the present embodiment, these will be called respectively the signal RST00 and RSN00.

Figure 10:
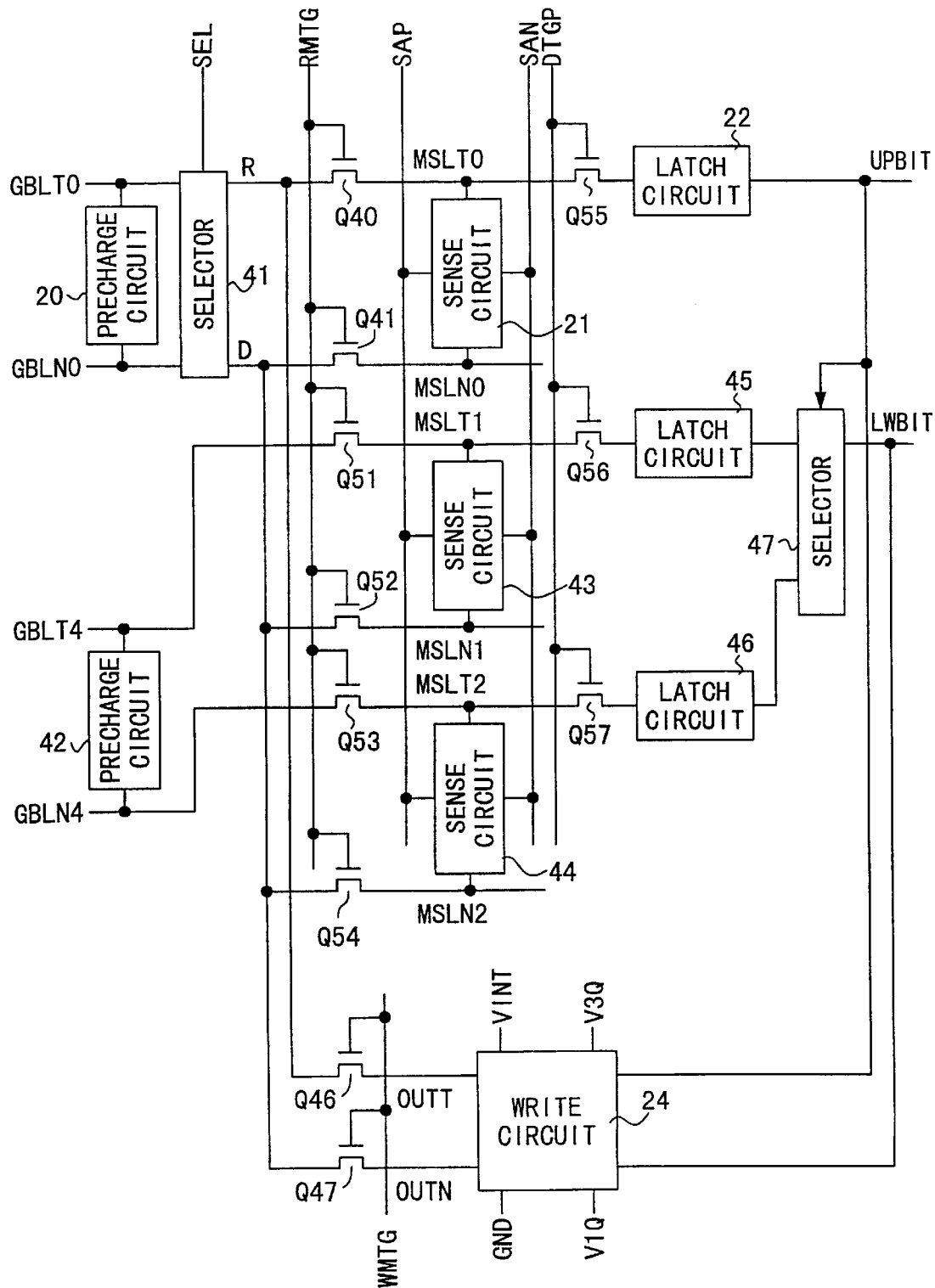
FIG. 10 is a circuit diagram showing an example of the structure of the MSA in The same embodiment.

Next, referring to FIG. 10, a concrete structure of the MSA33 will be explained. Moreover, in this figure, essential elements that are the same as those shown in FIG. 4 and FIG. 9 have identical reference symbols. Below, when explaining only the parts that differ from the first embodiment, first in the first embodiment (FIG. 4), the main bit line GBLT0 was directly connected to TrQ40 and GBLN0 was directly connected to TrQ41, but in the present embodiment, a selector 41 is inserted therebetween. This selector 41 determines according to the signal SEL whether or not either of the main bit lines GBLT0 and GBLN0 will be connected to TrQ40 and TrQ41. Specifically, the signal SEL is controlled such that one main bit line into which the data of a memory cell is loaded is connected to the D terminal, while the other main bit line into which the reference level corresponding to ½ VCC is loaded is connected to the R terminal.

The reason for providing the selector 41 is that because the DRAM in each embodiment of the present invention uses what is called a "folded bit line", the memory cells, like the dummy cells, are alternately distributed as True and False. For example, in FIG. 9, memory cells arranged in the same matter as those connected to word lines WLn0 are connected to the word line 01 (not illustrated) adjacent to the word line WL00. Thus, for example, if the signal SEL is set at H level in the case that the word line WL00 is activated, in the case that the word line WL01 is activated, the signal SEL must contrariwise be set at L level. Moreover, a selector 41 can also be provided in SSAs, but because there are a plurality of SSAs (actually, many more SSAs than shown in FIG. 8) for each one MSA, in order to reduce as much as possible the circuit scale, the selectors 41 are provided in the MSAs. Moreover, in the first embodiment described above as well, the same selector can be provided in the MSA shown in FIG. 4.

Next, the precharge circuit 42 has the same structure as the precharge circuit 20, and both the main bit lines GBLT4 and GBLN4 are precharged to ½ VCC. Next, in the first embodiment, and the comparison between the data in the memory cells and the three reference levels is a time division operation sharing one sense circuit 21. In contrast, in the present embodiment, the comparison with each reference level is carried out in parallel by the three sense circuits 21, 43, and 44. Specifically, the sense circuit 21 discriminates whether the difference in levels between the signal lines MSLT0 and MSLN0 is 0x or 1x, the sense circuit 43 discriminates whether the difference in levels between the signal lines MSLT1 and MSLN1 is 00 or 01, and the sense circuit 44 discriminates whether the difference in levels between the signal lines MSLT2 and MSLN2 is 10 or 11.

Next, TrQ51 and TrQ52 have the same respective functions as TrQ40 and TrQ41, and depending on the signal RMTG, the main bit line GBLT4 and the signal line MSLT1 are connected or separated, and the D terminal of the selector 41 and the signal line MSLN1 are connected or separated. Similarly, depending on the signal RMTG, TrQ53 and TrQ54 respectively connect or separate the main bit line GBLN4 and the signal line MSLT2 and connect or separate the D terminal of selector 41 and the signal line MSLN2. Next, as explained in the first embodiment, the latch circuit 22 holds the upper bit of the data in the memory cell. On the one hand, the latch circuit 45 holds the data of the upper bit when the upper bit is 0, and latch circuit 46 holds the data of the lower bit when the upper bit is 1. On the other hand, selector 47 selects the output of the latch circuit 45 as the lower bit LWBIT when the upper bit is 0, and otherwise selects the output of latch circuit 46 as the lower bit LWBIT. In addition, depending on the level of the signal DTGP, TrQ55 to TrQ57 respectively separate or connect the signal lines MSLT0, MSLT1, MSLT2, which output the result of the sensing of sense circuits 21, 43, and 44, and the latch circuits 22, 45, and 46.

Next, the operation of the DRAM according to the above structure will be explained, but first, the case of carrying out reading from a memory cell will be explained.

(1) Reading Operation

Figure 11:
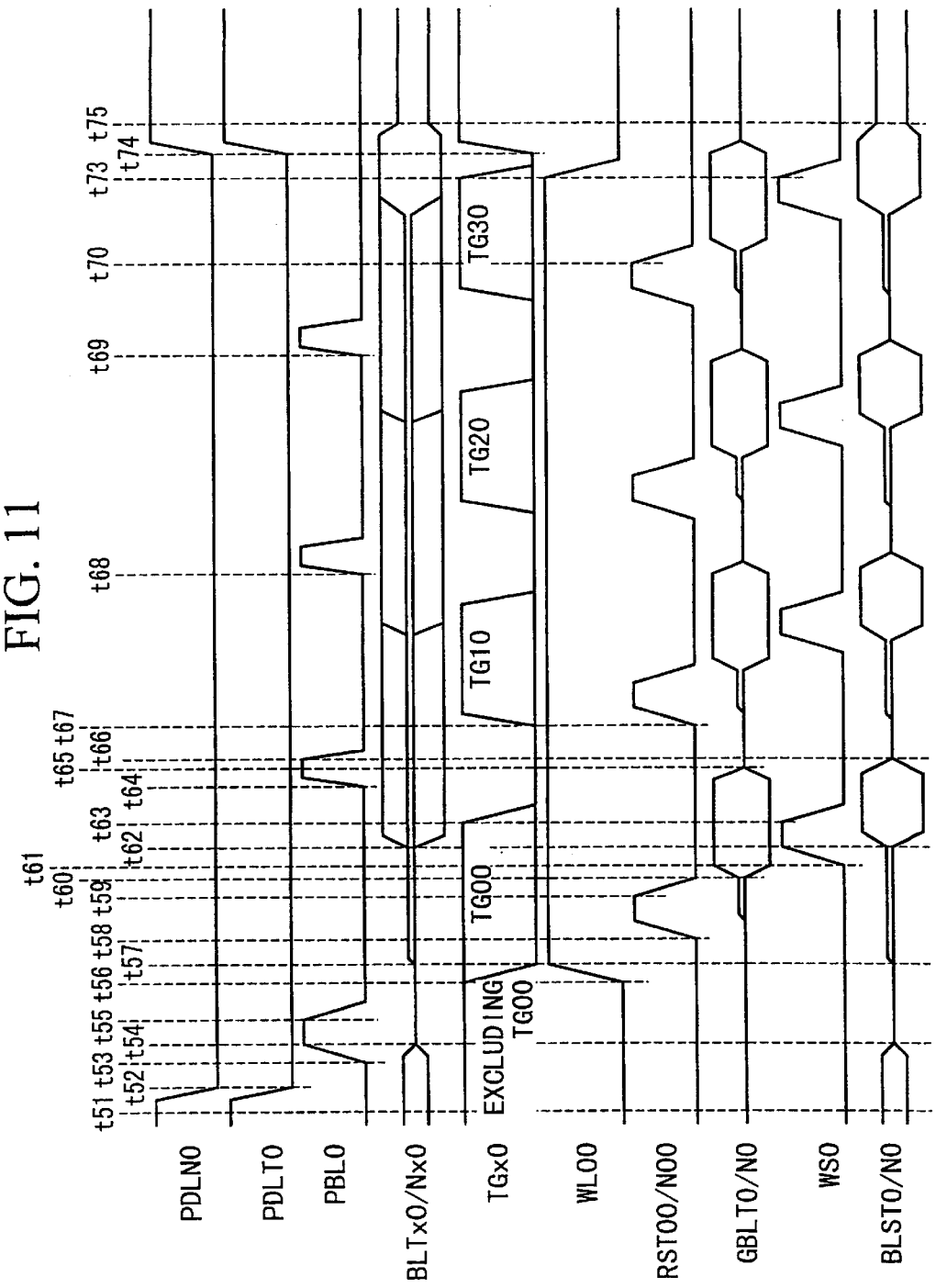
FIG. 11 is a timing chart showing the operation of the SSA included in the sub-array of the activated word line, among SSAs in the same embodiment.
Figure 12:
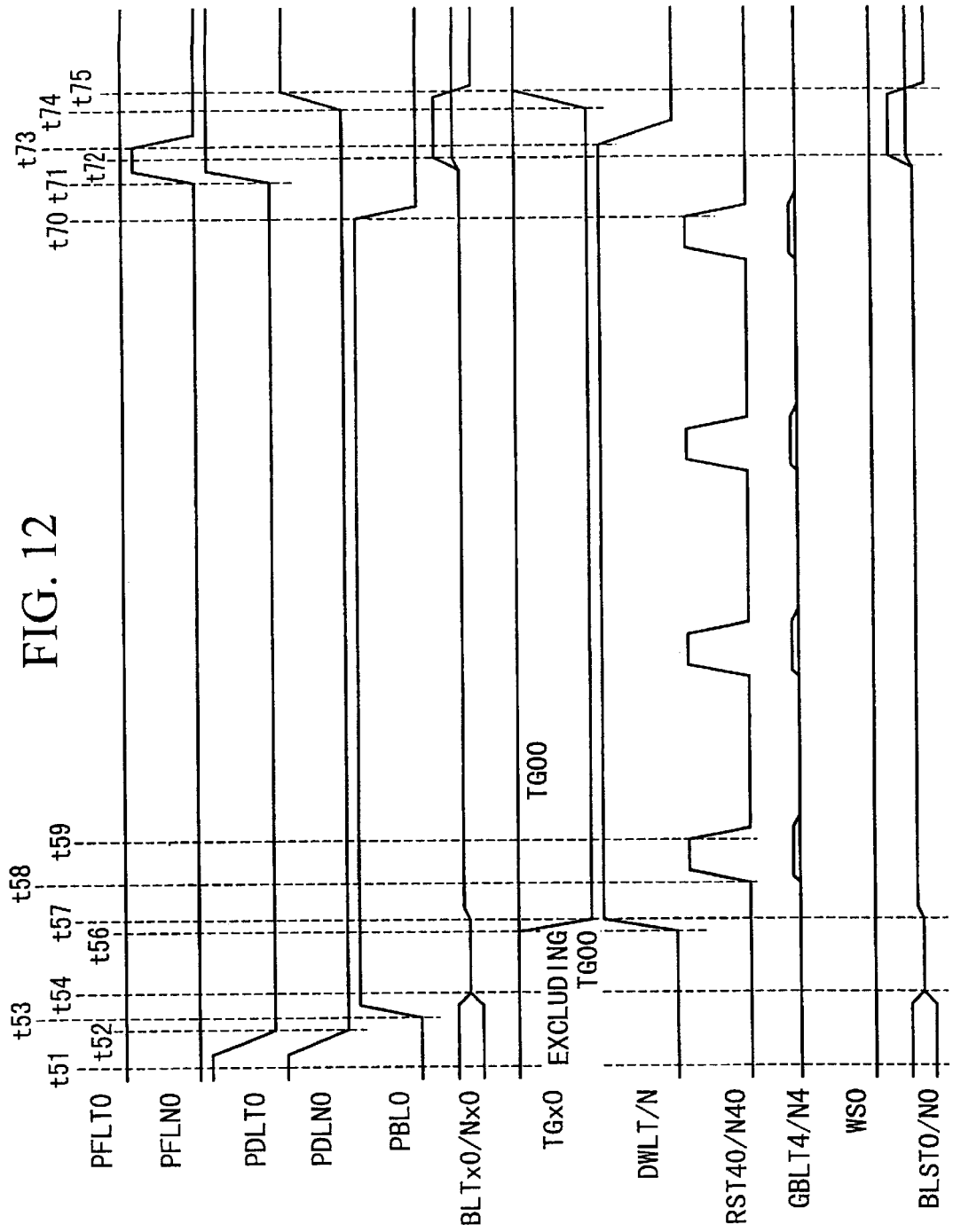
FIG. 12 is a timing chart showing the operation of the SSA included in the sub-array of the activated dummy word line, among SSAs in the same embodiment.

The following explanation assumes that reading of the memory cell connected to the word line WL in FIG. 8 is being carried out. In the present embodiment, first the reading of the four memory cells in the su-array included in the SSA30 is carried out in sequence, and subsequently, the reading of the four memory cells in the sub-array included in the SSA34 is carried out in sequence. At this time, in the first embodiment, each memory cell is sensed three times by time division, while in the present embodiment, the reading can be carried out with only one sensing. Here, FIG. 11 shows the operation timing of the SSA30 shown in FIG. 8, and FIG. 12 shows the operation timing of the SSA3 and the SSA32. Moreover, compared to the operation of the MSA13 explained in the first embodiment, the operation of the MSA33 is very simple, and so a timing chart has not been produced.

① Standby State

First, in the standby state up to time t51, in each of the SSA30 to the SSA32, the signals PDLN0, the signal PDLT0, and the signal TGx0 are set at H level. Thereby, the main bit line BLTx0 and the signal line BLST0 in each SSA are charged to the potential V3Q, and the main bit line BLNx0 and the signal line BLSN0 in each SSA is charged to the potential V1Q. In addition, in the MSA33, the precharge circuit 20 precharges both the main bit lines GBLT0 and GBLN0 to ½ VCC, and precharge circuit 42 precharges both the main bit lines GBLT4 and GBLN4 to ½ VCC. Furthermore, in the MSA33, the level of the signal SEL is set as appropriate, and the main bit line GBLN0 that carried the data of the memory cell connected to the word line WL00 and the D terminal of selector 41 are connected, and at the same time the main bit line GBLT0 that carried the reference level and the R terminal or the selector 41 are connected.

② Setting Reference Levels

Next, in each of the SSA30 to the SSA32, the signal PDLT0 and the signal PDLN0 are reduced, and at time t52, these signals are set at L level. Next, at time t53, the signal PBL0 rises, and at time t54 when it becomes H level, the main bit lines BLTx0 and BLNx0 are balanced with the signal lines BLST0 and BLSN0 in each SSA, and all of the potentials of these signal lines are precharged to ½ VCC. Next, at time t55, only in the SSA30 the signal PBL0 is reduced, and the signal lines BLST0 is cut off from BLSN0.

Subsequently at time t56, the word line WL00 is activated, and at the same time, in the SSA30, among the signals TGx0 (x=0 to 3), those other than signal TG00 are all reduced. In addition, at this time, both the dummy lines DWLT and DWLN are activated, and like the SSA30, in the SSA31 and the SSA32, except for the signal TG00, all the signals TGx0 are reduced. Thereby, at time 57, the word line WL00 rises sufficiently, and the potential corresponding to the data in the memory cell (refer to FIG. 8) disposed at the intersection of the word line WL00 and the sub-bit line BLN00 is transmitted to the signal line BLSN0 in the SSA30 via sub-bit line BLN00.

In addition, at the same time t57, both the dummy word lines DWLT and DWLN have risen sufficiently, and in the SSA31, the potential 0 of the dummy cell connected to the dummy word line DWLN is output to the signal line BLST0, and in addition, the potential ⅓ VCC of the dummy cell connected to the dummy word line DWLT is read by the signal line BLSN0. At this time, in the SSA31, the signal PBL0 is maintained as-is at H level, and thus the potentials on the two the signal lines are balanced, and the reference levels (potentials corresponding to ⅙ VCC) for discriminating 10 and 11 are obtained on the signal lines BLST0 and BLSN0. Similarly, in the SSA32, the potential ⅔ VCC of the dummy cell connected to dummy word line DWLN is read out on the signal line BLST0, and in addition, the potential VCC of the dummy cell connected to dummy word line DLWT is read out on the signal line BLSN0. Thereby, due to the balancing of both potentials, the reference levels for discriminating 00 and 01 are obtained on the signal lines BLST0 and BLSN0.

③ Simultaneous Sensing of the Upper Bit and Lower Bit

Next, at time t58, in the SSA30, when both the signals RST00 and RSN00 rise, the potential corresponding to the data in the memory cell on the signal line BLSN0 is reverse amplified and transmitted to the main bit line GBLN0. In addition, the reference level corresponding to ½ VCC on the signal line BLST0 is reverse amplified and transmitted to the main bit line GBLT0. In addition, at the same time t58, in the SSA31, by raising the signal RST40, the reference level (corresponding to ⅙ VCC) on the signal line BLST0 is reverse amplified and transmitted to the main bit line GBLN4. Furthermore, at the same time t58, in the SSA32, by raising the signal RSN40, the reference level (corresponding to ⅚ VCC) is reverse amplified and transmitted to the main bit line GBLT4.

At this time, because the main bit lines GBLT0 and GBLN0 are respectively connected to R terminal and D terminal by the selector 41 in the MSA33, the potential corresponding to the data held in the memory cell is output from the same D terminal, and from the same R terminal, the potential corresponding to ½ VCC is output. In addition, at this time, as explained in the first embodiment (FIG. 7), because the signal RMTG inverts to H level, the potential output from the D terminal of the selector 41 is transmitted to the signal lines MSLN0 to MSLN2. At the same time, the potential output from the R terminal of selector 41 is transmitted to the signal line MSLT0, and the potential of the main bit lines GBLT4 and GBLN4 are respectively transmitted to the signal lines MSLT1 and MSLT2. Subsequently at time t59, in the SSA30, the signals RST00 and RSN00 are reduced, in the SSA31, the signal RST40 is reduced, and in the SSA32, the signal RSN40 is reduced. In addition, at the same time t59, the signal RMTG is reduced in the MSA33 (not illustrated).

Next, in the MSA33, the signals SAP and SAN are activated, and a sensing operation is carried out in parallel simultaneously for sense circuits 21, 42, and 44. As a result, the sense circuit 21 amplifies the difference in levels of the signal lines MSLT0 and MSLN0, and the H and L levels, which respectively correspond to the values 1 and 0 on the upper bit of the stored data of the memory cell are output on the signal line MSLT0. Here, as explained in the first embodiment, along with the activation of the signals SAP and SAN, because the signal DTGP rises, the result of sensing by the sense circuit 21 is loaded on the latch circuit 22 via TrQ55, and is in a state wherein the upper bit UPBIT can be output. Similarly, sense amplifier 43 amplifies the deference in levels of the signal lines MSLT1 and MSLN1, ant outputs to the signal line MSLT1 the data of the lower bit when the upper bit is 0 based on a comparison between the data in the memory cell and the reference level ⅚ VCC, and the latch circuit 45 loads the data via TrQ56. Furthermore, the sense circuit 44 amplifies the difference in levels of the signal lines MSLT2 and MSLN2, and outputs to the signal line MSLT2 the data of the lower bit when the upper bit is 1 based on a comparison between the data in the memory cell and the reference level ⅙ VCC, and the latch circuit 46 loads the data via TrQ57. Thus, when the loading of each latch has been completed, the signal DTGP is reduced, and at the same time the signals SAP and SAN are deactivated. In addition, depending on the upper bit UPBIT output from the latch circuit 22, the selector 47 selects either the output from latch circuit 45 or latch circuit 46, and outputs the result as the lower bit LWBIT.

④ Rewriting the Memory Cell

Subsequently, at time t60, in the MSA33 (not illustrated), the signal WMTG is reduced, and the write potential that the write circuit 24 generates depending on the upper bit UPBIT and the lower bit LWBIT is provided to the main bit lines GBLN0 and GBLT0 via D terminal and R terminal of the selector 41. Next, at time t61, when the signal WS0 rises to the H level at time t62 only in the SSA30, the potential of the main bit line GBLN0 is provided to the signal line BLST0 and the sub-bit line BLT00, and the potential of the main bit line GBLT0 is provided to the signal line BLSN0 and the sub-bit line BLN00. As a result, the SSA30 carries out rewriting of the memory cell positioned at the intersection of the word line WL00 and the sub-bit line BLN00. Next, at time t63, in the SSA30, both the signal TG00 and the signal WS0 are reduced, and the rewriting is completed. The above operations completes the read operation of the memory cell corresponding to the signal TG00 in a sub-array included in the SSA30.

⑤ Reading the Other Memory Cells

Subsequently, the reading of the memory cells corresponding to the signals TG10, TG20, and TG30 are carried out in sequence, these operations are basically the same as the case of activating the signal TG00. First, in activating the signal TG10, at time t64, in the SSA30, the signal PBL0 rises, and at the same time, the main bit lines are precharged by the precharge circuits 20 and 42. As a result, at time t65 all the main bit lines GBLT0, GBLN0, GBLT4, and GBLN4 are precharged to ½ VCC. In addition, the sum of the potentials in output terminals OUTT and OUTN of the write circuit 24 become VCC, and thus at time t66 the signal lines BSLT0 and BLSTN0 are balanced, and precharged to ½ VCC. In addition, waiting for this precharge, in the SSA30, the signal PBL0 is reduced. Next, at time t67, the signal TG10 rises, and the stored potential of the memory cell connected to sub-bit line BLN10 is read out on the signal line BLSN0. Additionally, operations subsequent to time t68 are the same as the operations in times t58 to t64 when the signal TG00 is activated.

Next, the operation when the signal TG20 (times t68 to t69) and TG30 (times t69 and after) are activated is basically the same as the operation (times t64 to t68) when the signal TG10 is activated.

⑥ Rewriting the Dummy Cells

Originally, similar to the first embodiment, the operation when the signal TG30 is activated differs in one part when carrying out rewriting of the dummy cell. Specifically, at time t70, in the SSA31 and the SSA32, the signal lines BLST0 and BLSN0 are cut off from each other by reducing the signal PBL0. In addition, arriving at this point, the sense operation by the MSA33 is completed, and thus in the SSA31 and the SSA32, the respective the signals RST40 and RSN40 are reduced, and the main bit lines GBLN4 and GBLT4 are cut off from these SSAs. Thus, at time t71, although not illustrated in the timing chart in FIG. 12, in the SSA31, both the signal PDLN0 and PFLT0 are raised.

Thereby, at time t72, the signal lines BLSN0 and BLST0 in the SSA31 respectively become potential V1Q and potential GND, but at this time, because the signal TG00 is maintained as-is at H level, these potentials are respectively rewritten to dummy cells connected to dummy word lines DWLT and DWLN. In parallel with this, at the same time t71, in the SSA32, both the signal lines PFLN0 and PDLT0 are reduced. Thereby, at time t72, the signal lines BLSN0 and BLST0 in SSA32 respectively become potential VINT and potential V3Q, but in the SSA32 as well, the signal TG00 is maintained as-is at H level, and thus these potentials are respectively rewritten to the dummy cells connected to dummy word lines DWLT and DWLN.

If rewriting of the dummy cells is carried out in this manner, at time t73, the word line WL00 and dummy word lines DWLT and DWLN are all reduced. In addition, in the SSA31 and the SSA32, at time t73, after the signal PFLN0 is reduced, at subsequent time t74, the signal PDLN0 rises, and at the same time, except the signal TG00, which is already at H level, the signals TGx0 (x=1 to 3) all rise. As a result of these operations, at time t75, the SSA31 and the SSA32 are restored to standby state, like time t51, and the signal line BLST0 and the sub-bit lines BLTx0 connected thereto become potential V3Q, and the signal line BLSN0 and the sub-bit lines BLNx0 connected thereto become potential V1Q.

At the same time, for the SSA30, at time t74, the signal PDLN0, the signal PDLT0, and the signal TGx0 all rise. As a result, at time t75, all of the sub-bit lines BLTx0 and BLNx0, and the signal lines BLST0 and BLSN0 in the SSA30 become the same potential as in standby state at time t51.

In the above manner, the reading from the SSA30 is completed, and thus subsequently, the reading from the SSA34 is carried out similarly to the case of reading from the SSA30. Thereby, for memory cells disposed at the intersection of the word line WL and the sub-bit lines connected to the SSA34 as well, the potentials stored originally in these memory cells are rewritten.

(2) The Writing Operation

Because the operation of writing into the memory cell is the same as the writing operation explained in the first embodiment, its explanation will be omitted here.

Third Embodiment

Figure 13:
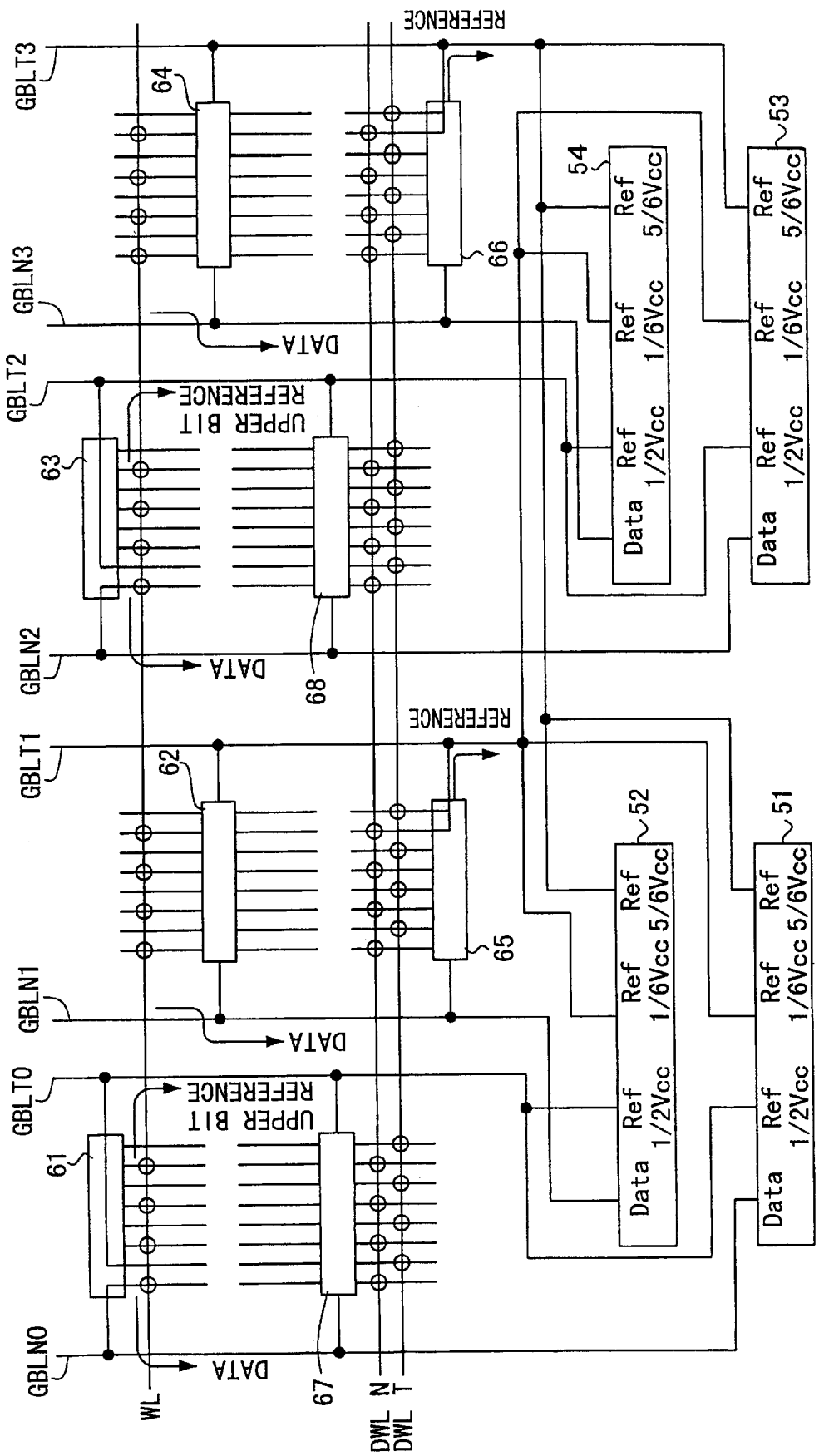
FIG. 13 is a block diagram showing the structure of the essential elements of the DRAM according to the third embodiment of the present invention.

In the above-described second embodiment, sensing is carried out essentially in two stages, but in the present embodiment, by carrying out the sensing in one stage, the operating time can be further reduced. FIG. 13 is a block diagram showing the structure of the essential elements of the DRAM according to the present embodiment, and essential elements of the structure that are the same as those shown in FIG. 8 (the second embodiment) have the same reference symbols. In the present embodiment, twice as many sub-arrays, SSAs, and main bit lines are used as those in the second embodiment, and at the same time, four times as many the MSAs are used as in the second embodiment to carry out access of the memory cells.

Thus, in the present embodiment, for one word line WL, 4 pairs×4=16 pairs of sub-bit lines intersect, and 16 memory cells are disposed where they intersect. Similarly, for the dummy word lines DWLT and DWLN, 16 sub-bit lines intersect, and 16 dummy cells are disposed where they intersect. In addition, the MSA51 to the MSA54 in the figure all have the same structure as the MSA33 explained in the second embodiment, and discriminate the upper and lower bits of the relevant data by one sense operation based on the data in the memory cells respectively sensed by the SSA61 to the SSA64 (explained below) and three types of reference levels. Moreover, in the same figure, the illustration of the upper bit UPBIT and the lower bit LWBIT output from each MSA has been omitted for the sake of simplification.

Next, the structures of the SSA61 to the SSA68 are all the same as SSAs explained in the second embodiment, but their respective functions are different. Specifically, the SSA61 to the SSA64 are SSAs having the same functions as the SSA30 and the SSA34 shown in FIG. 8, and output the potentials corresponding to the data in the memory cells and the reference levels ½ VCC. Specifically, the SSA61 supplies the data to the MSA51 via the main bit line GBLN0, and the reference levels to the MSA51 and the MSA52 via the main bit line GBLT0. In addition, the SSA62 supplies data to the MSA52 via GBLN1, but does not output anything to the main bit line GBLT1. In addition, the SSA63 supplies data to the MSA53 via the main bit line GBLN2, and at the same time supplies reference levels to the MSA53 and the MSA54 via the main bit line GBLT2. In addition, the SSA64 supplies data to the MSA54 via the main bit line GBLN3, but does not output anything to the main bit line GBLT3. Moreover, whether data or reference levels are output to any of the main bit lines or whether nothing is output to the main bit lines can be easily realized by appropriately controlling the signals RGT00, RSN00, RST40, and RSN40 (refer to FIG. 9).

At the same time, the SSA65 and the SSA66 have the same function as the SSA31 and the SSA32 shown in FIG. 8, and both potentials held in the dummy cells connected to dummy word lines DWLT and DWLN are balanced, and the reference levels are generated and output. Among these, the SSA65 distributes to each of the MSA51 to the MSA54 reference level ⅙ VCC via the main bit line GBLT1. At the same time, the SSA66 distributes to each of the MSA51 to the MSA54 reference level ⅚ VCC via the main bit line GBLT3. Moreover, only in the case shown in FIG. 13, the SSA67 and the SSA68 do not output anything to the main bit lines, and have no direct relationship to the operations explained below.

Because operation of the operation of the DRAM having the above structure can be easily understood from the operation in the second embodiment, here, no specific timing chart will be exhibited.

For example, in the case of carrying out reading from a memory cell, the SSA61 to the SSA64 read in parallel data of the memory cells respectively connected to the selected sub-bit lines, and supply the potentials corresponding to these data to the respective the MSA51 to the MSA54 via the main bit lines GBLN0 to GBLN3. At the same time, the SSA61 supplies a reference level corresponding to ½ VCC to the MSA51 and the MSA52 via the main bit line GBLT0, and the SSA63 supplies the same reference level to the MSA53 and the MSA54 via the main bit line GBLT2.

At the same time, the SSA65 supplies to each MSA a reference level corresponding to ⅙ VCC via the main bit line GBLT1, and the SSA66 supplies to each MSA a reference level corresponding to ⅚ VCC via the main bit line GBLT3. Thus, the MSA51 to the MSA54 simultaneously discriminate in parallel and output the upper and lower bits of the read data following the second embodiment based on the separately read data and the three types of reference level. Moreover, along with this reading, rewriting to the memory cells and dummy cells is carried out in exactly the same manner as in the second embodiment.

In addition, the write operation to the memory cell is the same as the write operation in the first embodiment and the second embodiment, and thus the explanation thereof has been omitted here.

Moreover, in FIG. 13, the reference level ½ VCC was respectively supplied from the SSA61 and the SSA63 to the two the MSAs, but this can be distributed to all the MSAs from only one SSA among these.

Fourth Embodiment

Figure 14:
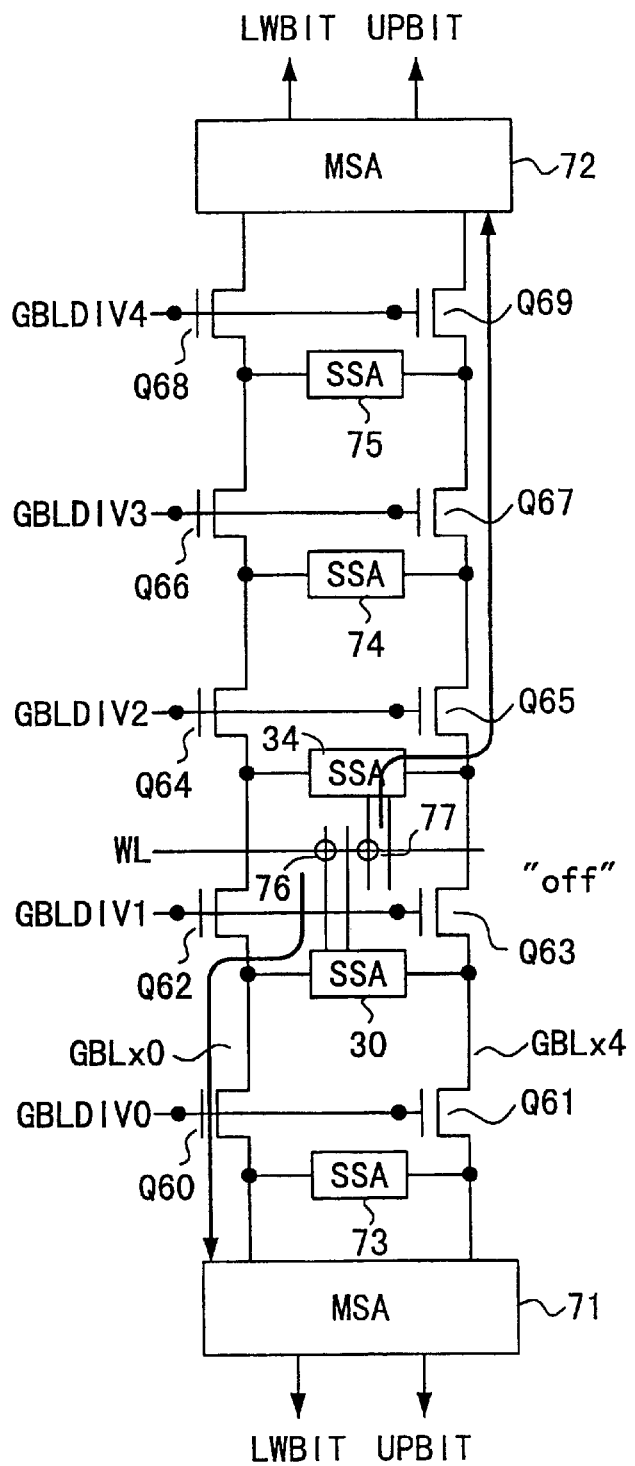
FIG. 14 is a block diagram showing the structure of the essential elements of the DRAM according to the fourth embodiment of the present invention.

The present embodiment can further reduce the operation time by ½, by adding modifications to the structure of the second embodiment. FIG. 14 is a block diagram showing the structure of the necessary parts of the DRAM according to the present embodiment, and the essential elements of the structure that are the same as those shown in FIG. 8 (the second embodiment) have identical reference symbols. Moreover, in order to focus on the flow of the data read out form the memory cells, in FIG. 14, the dummy cells and dummy word lines shown in FIG. 8 have all been omitted, and only a part of the main bit lines connected to the word line WL are illustrated. In addition, both the MSA71 and the MSA72 have the same structure as the MSA33 shown in FIG. 8, and actually although four main bit lines are respectively connected to each MSA, in order to simplify the illustration, the main bit lines GBLT and GBLN0 have been combined and shown as the main bit lines GBLx0, while the main bit lines GBLT4 and GBLN4 have been combined and shown as the main bit lines GBLx4. Accompanying this, the SSA31 and the SSA32 shown in FIG. 8 have been combined and shown as the SSA73. In addition, the SSA74 is an SSA having a structure identical to the SSA73. Moreover, the SSA75 represents the other SSAs whose illustration has been omitted from FIG. 8, and have no relationship with the operations explained below.

Next, in the present embodiment, in the main bit lines GBLx0 and the main bit lines GBLx4, TrQ60 to TrQ69 have been inserted between the adjacent MSAs and SSAs and between adjacent SSAs. Additionally, by controlling these transistors respectively by the signals GBLDIV0 to GBLDIV4, the main bit lines GBLx0 and GBLx4 have a structure that can be separated into two parts. For example, TrQ60 and TrQ61 that are together controlled by GBLDIV0 are disposed on the main bit lines GBLx0 and GBLx4 between the SSA30 and the SSA73, and this is exactly the same for the transistors besides these.

Next, the operation of the DRAM according to the present embodiment will be explained. As described above, in the second embodiment, when carrying out reading from the memory cells, a time division operation is carried out in which a memory cell on the word line WL is read two times. In contrast, in the present embodiment, the upper and lower circuit blocks separated by the word line WL are sensed in parallel, and this type of time division operation is eliminated. Thus, in the present embodiment, first only the signal GBLDIV1 among the signals GBLDIV0 to GBLDIV4 are set at L level to turn off TrQ62 and TrQ63, and the main bit lines GBLx0 and GBLx4, separated by the transistors, are cut off from each other. Next, the SSA30 and the SSA73 supply to the MSA71 data read from the memory cell 76 on the word line WL and the three types of reference levels via the main bit lines GBLx0 and GBLx4, and the MSA71 discriminates the upper and lower bits of the data in memory cell 76. In parallel with this, the SSA34 and the SSA74 supply to the MSA72 the data read from memory cell 77 and the three types of reference levels via the main bit lines GBLx0 and GBLx4, and the MSA72 discriminates the upper and lower bits of this data.

In the above manner, in the present embodiment, because the MSAs are disposed in both the upper and lower sides of the regions in which the memory cell array is disposed, reading can be completed by a one-stage sensing operation. Moreover, in the above-described explanation, the technical conception of the present embodiment was applied to the second embodiment, but this can be applied to each of the other embodiments.

Summary of the First Through Fourth Embodiments

In the first through fourth embodiments explained above, FIGS. 15A through 15D show the total of the number of sensings. Moreover, in these figures, in addition to the 4 values that were the assumed condition of each of the above-described embodiments, 8 values and 16 values are also shown. In addition, FIG. 15D is the case in which the fourth embodiment is applied to the third embodiment, not the above-described fourth embodiment itself.

First, in the case of the first embodiment (FIG. 15A), the data in the memory cell is compared one by one with each of the reference levels. Thus, in the case that the memory cells are N-value, the number of time division sense operations (referred to hereinbelow as "time division in the MSA") necessary for the MSA to read data in one memory cell is (N−1) times. In addition, because four bit line pairs are the objects, there are always four time division operations (referred to hereinbelow as "TG time division") when sub-bit line pairs are selected in sequence while the signals TGx0 are switched in each SSA. Therefore, the number of sensings is the number of TG time divisions multiplied by the number of time divisions in an MSA. Moreover, the number of sensings is calculated is the same manner for the other embodiments.

Next, in the case of the second embodiment (FIG. 15B), because the comparison of all reference levels can be carried out simultaneously, the number of time divisions in an MSA is one time, irrespective of the number of multi-value levels of the memory cells. In contrast, the time division operations by the signal TG change depending on the number of multi-value levels in the memory cells. That is, because the main bit lines are shared by two SSAs in the case of 4-values, this totals 8 time division operations, which is twice the number of the first embodiment, and as a result, the number of sensings is 8. In addition, in the case of 8-values, the number of time divisions in an MSA is one time, the same as the 4-value case, while the number of TG time divisions is 16 times, corresponding to twice the 4-value case. Specifically, because the data in the memory cells and all the reference levels are read simultaneously, with 8 values, the main bit line requires at least 8 lines, and the number of sub-arrays corresponding to one MSA so as to conform to this is 4. Thus, the number of TG time divisions totals 4×4 bit lines=16 times, and the number of sensings likewise becomes 16 times. In addition, in the case of 16 values, the number of sub-arrays corresponding to one MSA is 8, which corresponds to twice that of 8 values, and thus, the number of TG time divisions and number of sensings are both 32 times.

Next, in the case of the third embodiment (FIG. 15C), the number of time divisions in an MSA is always one time, irrespective of the number of multi-value levels because the comparison with all reference values is carried out only once. With regards to the number of TG time divisions, in contrast to the sensing one by one of the data in the two sub-arrays when there are 4 values, for example, in the second embodiment, in the third embodiment, all the data in the sub-arrays and the reference levels are compared simultaneously. Thus, in the third embodiment, the number of TG time divisions is completed with ½ the times in the case of the second embodiment, and corresponding to this, the number of sensings is one-half that of the second embodiment.

Next, for the fourth embodiment, as with the case of the above-described application to the second embodiment, using the MSAs disposed both above and below the memory array, two memory cells can be sensed simultaneously. Thus, the number of TG time divisions is essentially ½, and corresponding to this, the number of sensings is also ½. Therefore, by applying (FIG. 15D) the present embodiment to the third embodiment, the number of TG time divisions and the number of sensings both fall to half the values shown in FIG. 15C.

Moreover, if the number of sensings is decreased, the operating time can be shortened by a corresponding amount, but the circuit scale of the MSA and the SSA increase in proportion to this amount, thus incurring area overhead, and at the same time, the number of metal wiring layers allocated for the main bit lines increases, bringing about an increase in cost. Therefore, a method having a small number of sensings is not always necessarily optimal, and depending on the number of sensings (operation time) and the trade-off between chip size and cost, which of the methods to apply is preferably decided by their appropriateness.

Fifth Embodiment

Figure 16A:
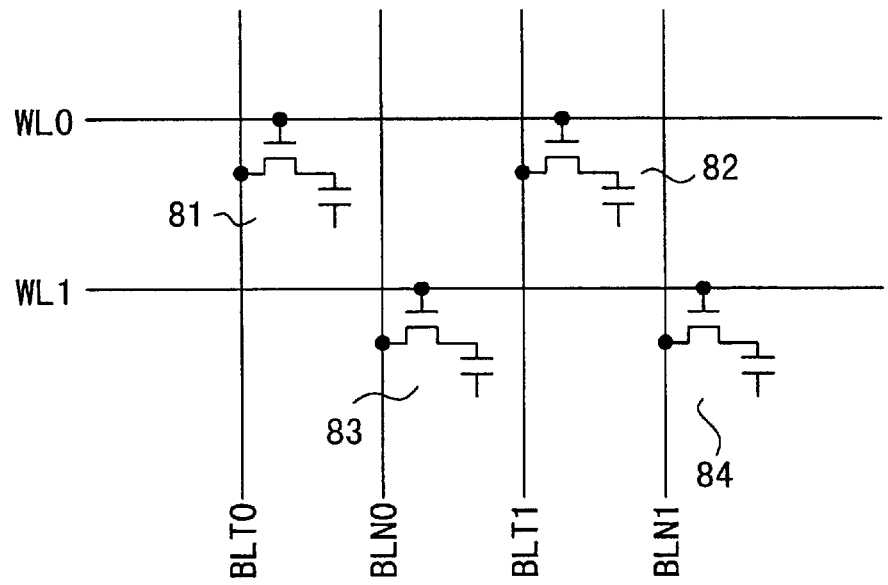
FIG. 16 is an explanatory drawing for explaining the noise via the word line.

In the present embodiment, a method of suppressing increase in sensing time due to noise in the word line path is implemented. Thus, first the problems caused by noise in the word line path will be explained below. Here, as shown in FIG. 16A, a folded bit line is assumed in which memory cells 81 and 82 are disposed at the intersection of the word line WL0 and the main bit lines BLT0 and BLT1, and the memory cells 83 and 84 are disposed at the intersection of the word line WL1 and the main bit lines BLN0 and BLN1. In addition, it is assumed that the power source potential VCC corresponding to 00 is stored in both memory cells 81 and 82 connected to the word line WL0.

Figure 16B:
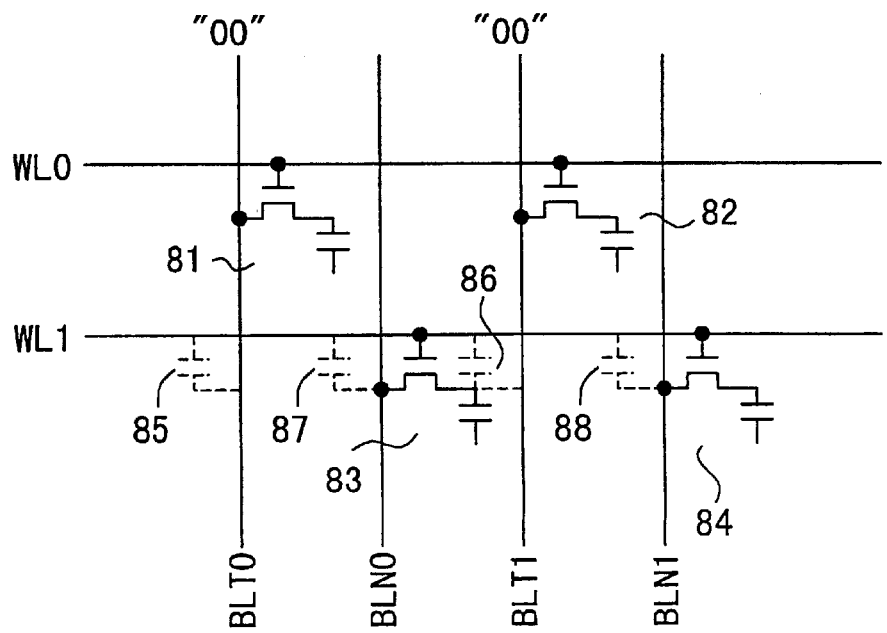

Under these conditions, when reading from memory cells 81 and 82 by activating word line WL0, the potential of the sub-bit lines BLT0 and BLT1 changes from ½ VCC, which is the precharge potential, to the potential on the sub-bit line (FIG. 2A) corresponding to data 00. At this time, because the sub-bit lines BLN0 and BLN1 are the reference side, they remain as-is at the reference level corresponding to ½ VCC. However, as shown in FIG. 16B, between the word line WL1 and the sub-bit lines BLT0, BLT1, BLN0, and BLN1 there are respective parasitic capacities 85 to 88. Thus, by reading from a memory cell, when, for example, the potential of sub-bit line BLT0 changes by voltage "α", via path sub-bit line BLT0 to parasitic capacitance 85 to the word line WL1 to parasitic capacitance 87 to sub-bit line BLN0, the potential of sub-bit line BLN0, which is originally ½ VCC, is raised by a pre-determined potential depending on "α" (in this case "α">0, and contrariwise, when "α"<0, the potential falls), and as a result, this becomes noise.

Of course, because this type of phenomenon occurs similarly in each sub-bit line besides sub-bit line BLN0, the potentials of the sub-bit lines as a whole are raised. Therefore, for the same sub-array, the noise becomes common, and for example, in the case that the SSA10 shown in FIG. 1 outputs data in the memory cell and a reference level ½ VCC, the problems due to the influence of noise do not occur. From this, the sensing of the upper bit can be carried out without waiting for the noise to be corrected. In contrast, as shown for example in FIG. 1, sub-arrays on which memory cells are present and each sub-array on which dummy cells are present are each different, and between these sub-arrays noise does not become common. Therefore, the sensing of the lower bit based on reference levels generated from potentials held in dummy cells must be carried out after the noise is corrected. In order to attain this, in each of the above-described embodiments, the time from the activation of the word line to the activation of the signals SAP and SAN is set, and time for suppressing the noise must be taken into consideration. Thus, the extra time necessary for sensing corresponding to this time is consumed.

Figure 17:
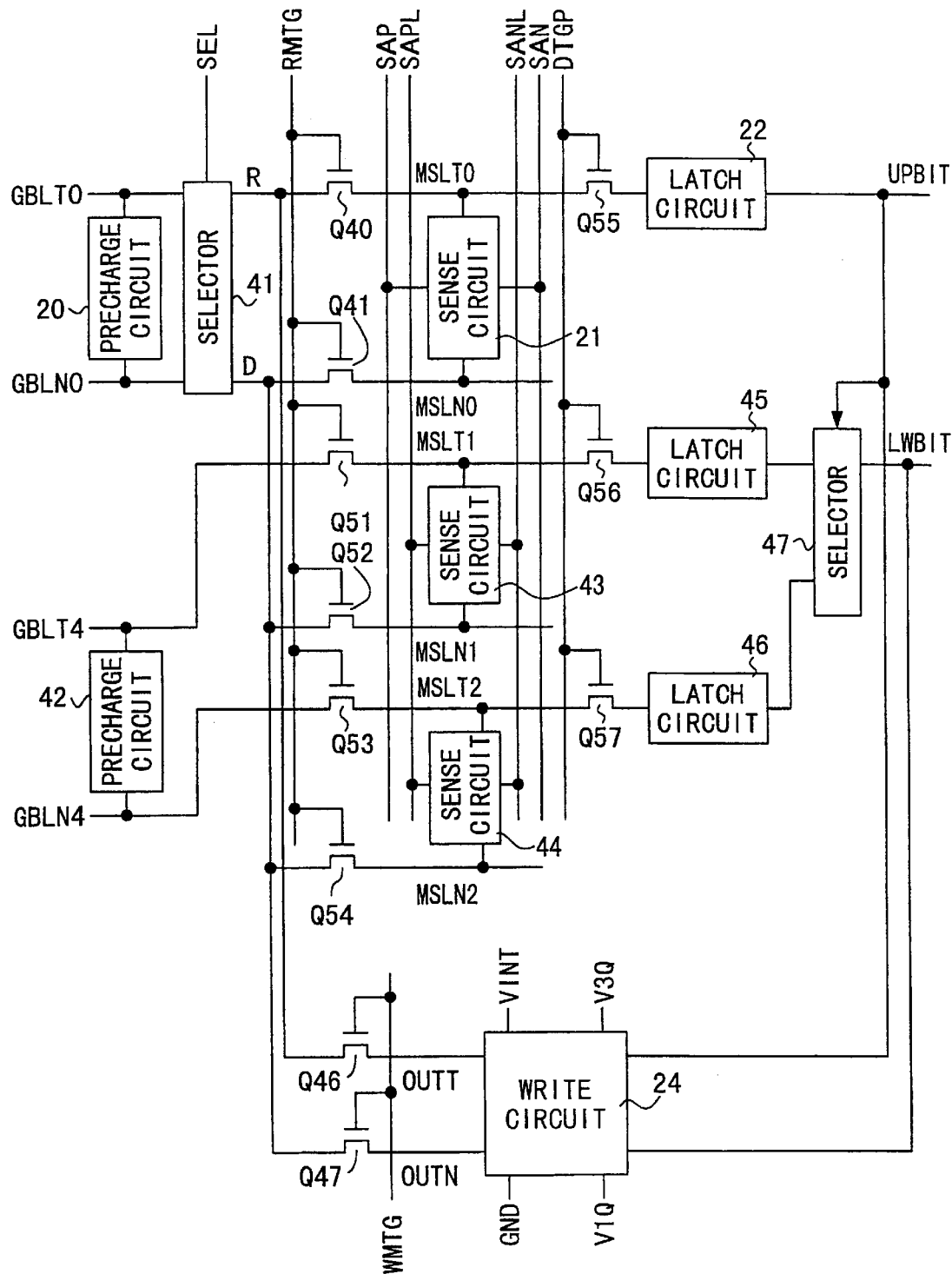
FIG. 17 is a circuit diagram showing an example of the structure of an MSA according to the fifth embodiment of the present invention.

From the above, in the present embodiment, the upper bit on which the noise becomes common is sensed first, and subsequently, the lower bit in which the noise is not common is sensed. FIG. 17 is a block diagram showing the detailed structure of an MSA in the case that the technology of the present embodiment is applied to the second embodiment, and identical structural elements have reference symbols identical to those in FIG. 10. The difference between the two lies in that, in the second embodiment the timing of the operation of the sense circuits 21, 43, and 44 is controlled by identical the signals SAP and SAN. In contrast, in the present embodiment, for the sense circuit 21 for sensing the upper bit, like the second embodiment, the signals SAP and SAN control the timing, but for sense circuits 43 and 44 that sense the lower bit, the signals SAPL and SANL control the timing. Here, only the activation and deactivation timings of these signals SAPL and SANL differs from those of SAP and SAN, and otherwise, these signals are the same as the signals SAP and SAN.

Next, because the operation of the present embodiment is basically the same as that of the second embodiment, a special timing chart is not exhibited. Thus, only the point of difference between this embodiment and the second embodiment will be explained. In the present embodiment, the upper bit is sensed by activating the signals SAP and SAN at a timing that is faster than that in the second embodiment, and subsequently, at a timing that is the same as that of the signals SAP and SAN in the second embodiment, the sensing of the lower bit is carried out by activating the signals SAP and SAN. This means that the timing of the signals SAP and SAN can be made faster on the whole only by an amount corresponding to the time for suppressing the noise. Moreover, naturally, the signals RMTG, DTGP, DGS, DGTU, etc., which are in synchronism with the timing of the signals SAPL and SANL must also be accelerated.

In the above manner, in the present embodiment, because the sensing proceeds from the upper bit on which the noise from the word line is common, compared with the case of sensing the upper bit and lower bit simultaneously after waiting for the noise to decrease, the upper bit can be output at a fast timing. Moreover, as described above, as explained in the case of application to the second embodiment, this can be applied to the other embodiments besides this one. Here, in the first embodiment, as shown in FIG. 4, because there is only one circuit, the timing of the signals SAP and SAN can be changed quickly only when the upper bit is sensed. In addition, the noise transmitted via a word line is produced not only in the case that the word line is activated, but also during rewriting, even though the amount is small. The present embodiment is effective for all cases in which the noise generated under these various conditions is propagated via a word line.

Sixth Embodiment

Figure 18:
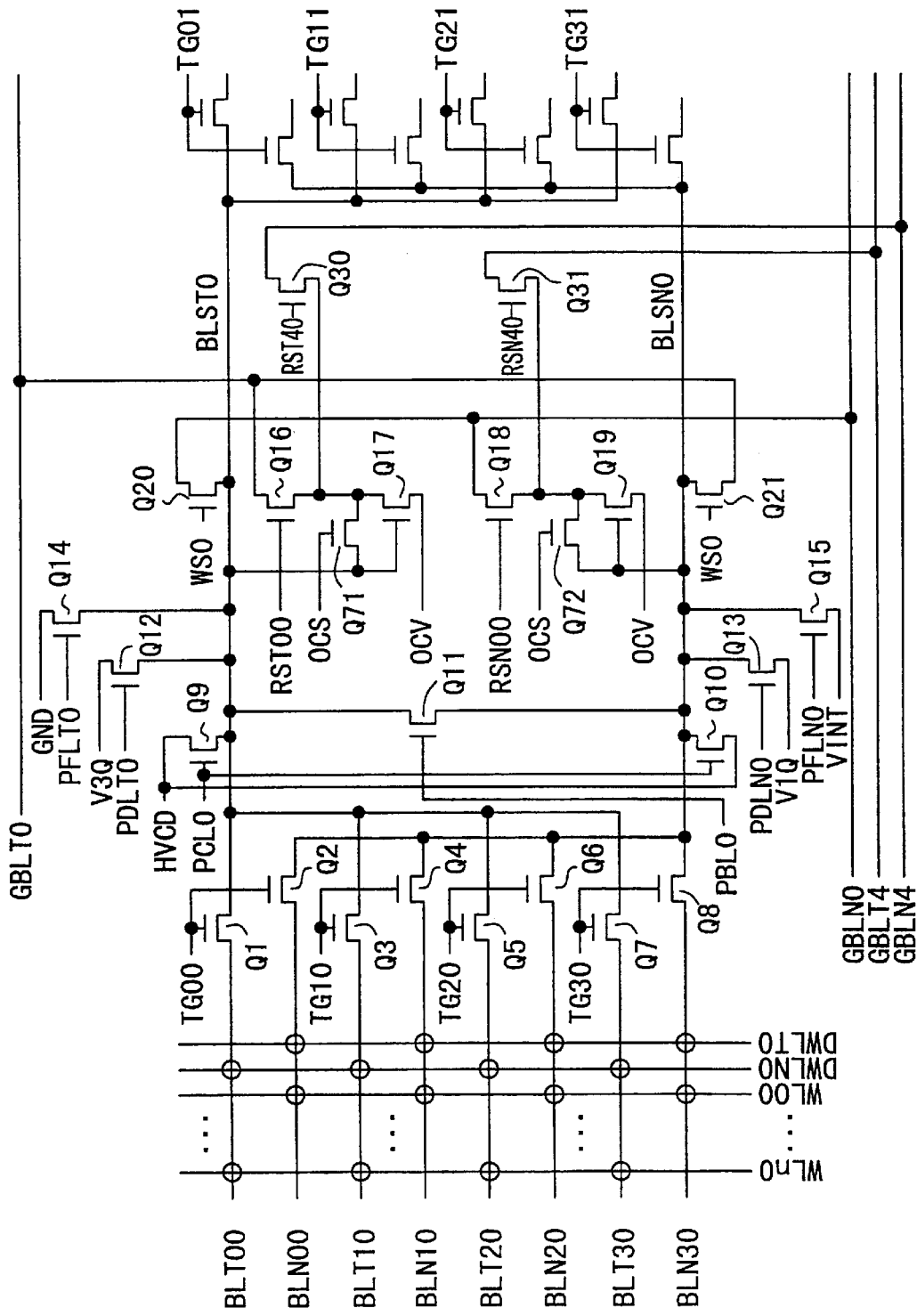
FIG. 18 is a circuit diagram showing an example of the structure of an SSA according to the sixth embodiment of the present invention.

In the present embodiment, a threshold voltage of a sense transistor provided in the SSA is for avoiding the influence of variance caused by manufacturing variation, etc, and implements what is termed an offset cancel countermeasure. For example, in the second embodiment, TrQ17 and TrQ19 in an SSA shown in FIG. 9 do not necessarily have a completely complementary operation due to this manufacturing variance. Thus, the difference in variation of the threshold voltage that exists between both sense transistors is linked to a deterioration in operational margins. In order to compensate this variation, in the present embodiment, the SSA is formed as shown in FIG. 18. Moreover, in the same figure, essential structural elements identical to those shown in FIG. 9 (second embodiment) have identical reference symbols.

Thus, the difference between the present embodiment and the second embodiment will be explained below. First, in the second embodiment, the sources of TrQ17 and TrQ19 are both connected to the potential GND, while in contrast in the present embodiment they are both connected to the signal OCV. In addition, in the present embodiment, TrQ71 and TrQ72, which connect the signal OCS to the gate terminal, are respectively inserted between the gate drains of TrQ17 and TrQ19. Here, the potential of the signal OCV is set at potential GND, like the second embodiment, when the signal OCS is not activated. In contrast, when the signal OCS is activated, the design value of the threshold voltage of TrQ17 and TrQ19 are set at VTH0, the potential of the signal OCV is set substantially at potential ½ VCC−VTH0. Moreover, this potential ½ VCC is preferably generated after balancing the potential V3Q and potential V1Q, as described above.

Next, except for the following points, the operation of the present embodiment is identical to the operation of the second embodiment described above. Specifically, during the interval of times t55 to t56 shown in FIG. 11, if the signal PBL0 in the SSA30 becomes L level, and the signal lines BLST0 and BLSN0 are cut off from each other, the signal OCS is activated only for a specific interval during this period, and TrQ71 and TrQ72 become conductive. At the same time, the signal OCV changes from potential GND to the above-described potential ½ VCC−VTH0. As a result of this operation, the potential of the signals BLST0 and BLSN0 respectively change only by a potential corresponding to the variance from the design value VTH0 existing in the actual threshold voltages of TrQ17 and TrQ19. Therefore, when sensing the potential of the signal lines BLST0 and BLSN0 by subsequently activating the signals RST00 and RSTN0, by the offset cancellation operation explained here, the variance in the threshold voltages between sense transistors can be eliminated.

Moreover, the above explanation is a case in which the signal TG00 is activated, but the timing in the case of activating the signals TG10, G20, and T30 is the same. In addition, in the above explanation, the technological concept of the present embodiments is incorporated into the second embodiment, but it can also be applied to each of the other embodiments.

Variant Example

Although explained simply above, for example, as shown in the timing chart (first embodiment) shown in FIG. 6, in the SSA11 and the SSA12, by activating only the signal TG00 among the signals TGx0, the dummy cell connected to sub-bit lines BLT00 and LBN00 are selected. However, because naturally a dummy cell may be defective, in such as case, instead of the signal TG00, any of TG10, TG20, or TG30 can be activated. Thereby, because it is possible to select and use dummy cells that are provided as redundancy dummy cells and are not defective, the reliability and yield can be improved.

Figure 19:
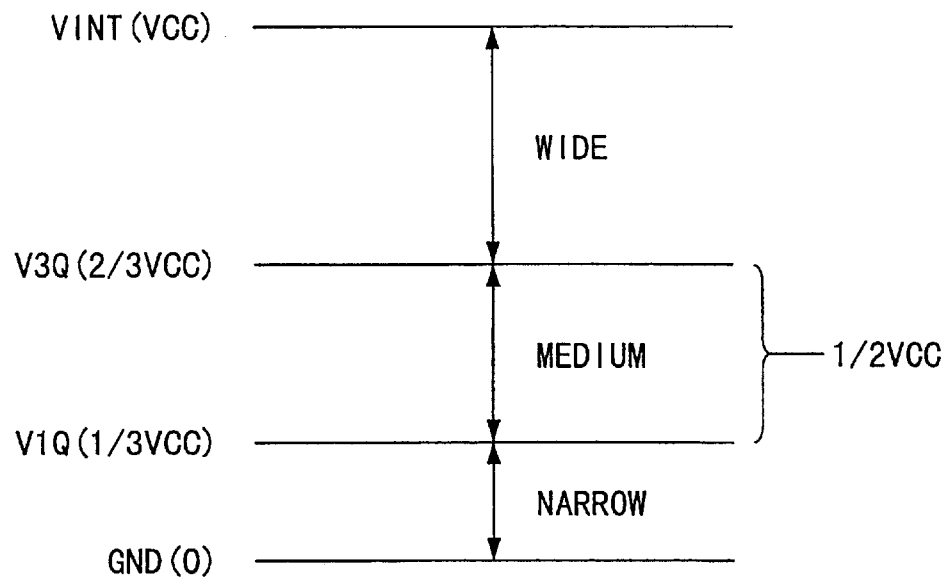
FIG. 19 is an explanatory drawing showing the condition when the potentials V3Q and V1Q are reduced in order to improve the holding characteristics in each of the embodiments of the present invention.

In addition, in each of the above-described embodiments, the voltages V3Q and V1Q need not be exactly ⅔ VCC and ⅓ VCC, but can have a slight degree of irregularity. Thus, in order to improve the holding characteristics of the DRAM as a whole, slightly lowering these potentials by an identical specified potential, as shown in FIG. 19, can be considered. That is, when the case of 4 values is used as an example, the holding characteristics of the cell into which 00, having the highest potential, is written are most severe. Thus, the potential VCC to potential ⅔ VCC can be slightly broadened so that there are no mistaken operations even when the hold potential is lowered due to deterioration of the holding characteristics of a memory cell or dummy cell that stores 00, and the potential ½ VCC to potential 0 can be slightly narrowed by this degree.

Figure 20:
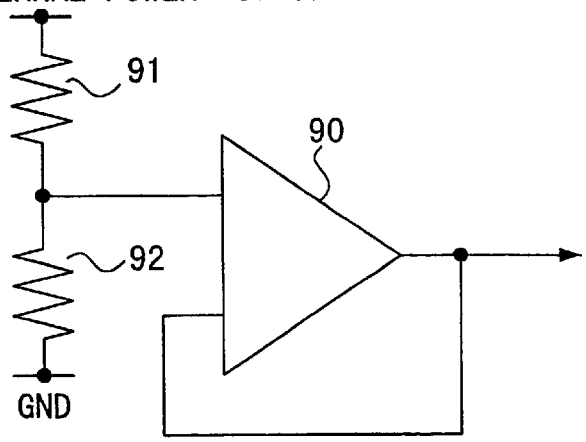
FIG. 20 is a circuit diagram schematically showing the structure of the pseudo-power source circuit used in each of the embodiments of the present invention.
Figure 21:
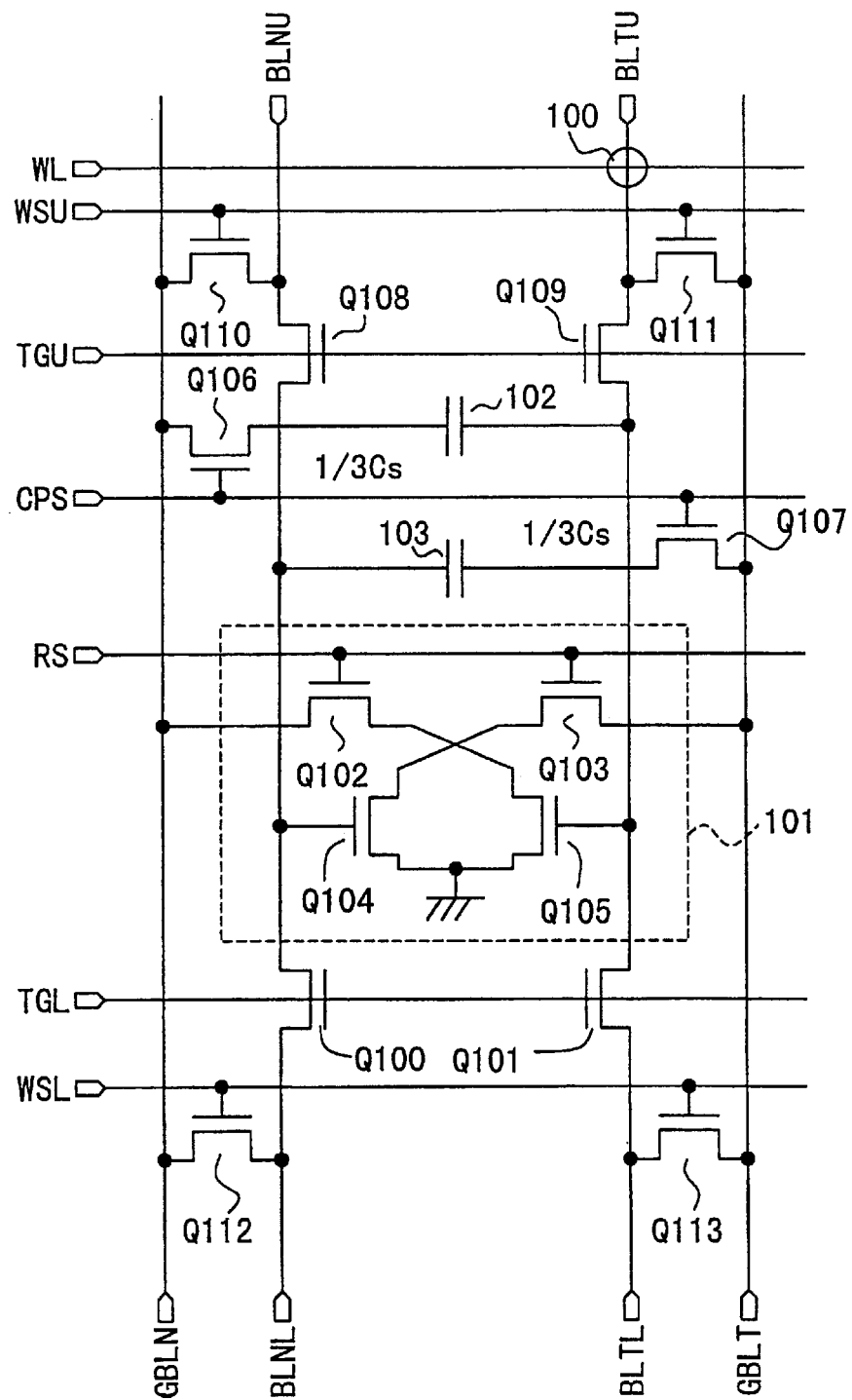
FIG. 21 is a block drawing showing the structure of the essential elements of the DRAM in the first example of conventional art.

Here, because the above potential V3Q and potential V1Q are both generated by a pseudo-power source (not illustrated), the regulation of these potentials can be easily carried out. In order to explain this point, the structure of a pseudo-power source is shown schematically in FIG. 20. In the illustrated example of a pseudo-power source, an amplifier 90 is provided in which the input terminal receives feedback from one of the output terminals, and at the same time two resistance elements 91 and 92 divide the external power source potential, supplied from outside the DRAM, and the GND potential, and the potential of the connection point node of these resistors is supplied to the other terminal of the amplifier 90. Thereby, by suitably regulating the resistance of the resistance elements 91 and 92, the potential output from the pseudo-power source can be easily regulated. Moreover, the extent to which potentials V3Q and V1Q are reduced can be suitably determined based on the current to voltage characteristics of the memory cells and dummy cells, the technical sense of a person skilled in the art of the necessary hold times, etc. Moreover, as explained above, the ½ VCC reference level is generated by balancing the potential V3Q and potential V1Q, and thus the ½ VCC potential also falls in conjunction by the amount that these potentials V3Q and V1Q are reduced. Therefore, the ½ VCC reference level is convenient.

In addition, in each of the above-described embodiments, a time division operation is carried out by selecting sub-bit line pairs in sequence according to the signals TGx0. However, this kind of time division operation is not essential to the structure of the present invention, and thus of course a structure without time division operation can be used.

In addition, in each of the above-described embodiments, the method explained in the first example of conventional art can be used as a method for rewriting to memory cells.

In addition, in each of the above-described embodiments, in the SSA that carries out reading of the data of the memory cell, a ½ VCC reference level is generated, but like the ⅙ VCC and ⅚ VCC reference levels, potentials (for example, ⅓ VCC and ⅔ VCC) read from dummy cells can be balanced and generated.

As explained above, in the present invention, each potential of multi-value data is stored in dummy cell pairs. Depending on which sub-array a memory cell activated by the selected word line belongs to, whether an SSA functions as a memory SSA or functions as a dummy SSA is determined for each SSA. An SSA that operates as a memory SSA senses the potential of multi-value data read via a sub-bit line from an memory cell outputs the result to a main bit line. In contrast, an SSA operating as a dummy SSA generates each reference level by balancing the potentials read from dummy cell pairs via a sub-bit line pair, and outputs the result to a main bit line. In addition, based on the potentials of these multi-value data and each reference level, the MSAs discriminate the multi-value data. Thereby, a multi-value semiconductor memory device can be realized that does not need feedback capacitors, as does conventional art, and thus the area can be reduced and the cost can be kept low. In addition, because oscillating the word line potential, as is done in conventional art, is not necessary, the problem of worsening yields due to lowering of operational margin because variation of the threshold voltages of the memory cells, which are much more numerous than SSAs, does not occur.

In addition, in a second aspect of the invention, because the potentials of the multi-value data are compared one by one while sequentially outputting by time division each reference level, the value of the multi-value data can be discriminated. Thereby, the values of multi-value data can be obtained irrespective of the number of multi-value levels simply by providing two main bit lines for loading the respective potentials of the multi-value data and each reference level.

In addition, in a third aspect of the invention, the output of a plurality of memory SSAs that sense the memory cells driven by identical word lines is supplied to identical main bit lines by time division. In contrast, dummy cell pairs that are sensed by a plurality of dummy SSAs are driven by identical dummy word lines, and each reference value is supplied to separate main bit lines. In addition, based on the potential of each multi-value data and all reference levels output simultaneously, the sequential discrimination by the MSAs of the values of each multi-value data that is sensed is carried out. Thereby, because the values of respective multi-value data can be discriminated with only one sense operation, the operation time can be reduced without making the structure very complex.

In addition, in a fourth aspect of the invention, the output of a plurality of memory SSAs that sense the memory cells driven by the identical word line is supplied respectively to a plurality of main bit lines. In contrast, an identical dummy word line drives the dummy cell pairs that are sensed by a plurality of dummy SSAs, and each reference level is supplied to separate main bit lines and respectively distributed over a plurality of the MSAs. In addition, the potentials of all multi-value data and all reference levels are output simultaneously, and the values of all multi-value data that are sensed are discriminated simultaneously. Thereby, the number of sensings can be further reduced from that of the invention according to the third aspect, and thus the operation time can be even further reduced.

In addition, in a fifth aspect of the invention, the main bit lines are separated using a switch device by the word lines that drive the memory cells that are the object of reading, and the values of the multi-value data read out simultaneously from the memory cells on the this word line are discriminated by the MSAs disposed surrounding the switch device on both sides. Thereby, because the number of sensings can be further halved, the operation time can be even further reduced.

In addition, in a seventh aspect of the invention, depending on whether the potential of the multi-value data is read out on one of the main bit lines among the two main bit lines that carry the potential of the multi-value data and the reference levels, the potentials on both of these main bit lines are switched by the MSA, and then sensed. Thereby, when using a folded bit line, the circuits for switching the two main bit lines are not in the plurality of SSAs, but are only provided in the MSAs, and thus the circuit scale can be reduced.

In addition, in a eighth aspect of the invention, in the case that noise generated under specified conditions when the word line is driven or during rewriting occurs on a sub-bit line via a word line, a reference level output from the dummy SSA is compared to the potential of the data of a memory cell after a specified time has passed during which this noise settles, after the reference level output by a memory SSA and the potential of data in the memory cell are compared. Thereby, in the case for example, of storing 4-value multi-value data in a memory cell, based on reference levels read out simultaneously with data from a memory SSA, there is no waiting for noise on the word line path to settle, and the upper bit can be output with a timing before the lower bit.

In addition, in a ninth aspect of the invention, the offset caused by the difference in threshold voltages that exists between a sense transistor pair that senses the voltage of a sub-bit line pair is cancelled. Thereby, the problem of deterioration of the operation margin due to the offset does not occur.

In addition, in a tenth aspect of the invention, each potential of the multi-value data, excluding the ground potential and the inner power source potential, is reduced to the same level. Thereby, the hold characteristics of memory cells and dummy cells can be improved.

In addition, in a eleventh aspect of the invention, except for dummy cell pairs used as defaults, redundancy dummy cell pairs are provided. Thereby, even when default dummy cells are defective or the holding characteristics become bad, these can be replaced with non-defective redundancy dummy cell pairs, and thus the reliability and yield can be improved.

In addition, in a twelfth aspect of the invention, except for the ground potential and the inner power source potential, the pseudo-power source circuit respectively generates each potential of the multi-value data Thereby, for example, when carrying out writing into a memory cell or a dummy cell, and when carrying out rewriting during the reading process, writing and rewriting can be carried out simply by selecting the pseudo-power source depending on the written data Thus, compared to the method of carrying out step-wise writing, as does the conventional art, the writing time can be reduced.

In addition, in a thirteenth aspect of the invention, the sub-bit line that is in the standby state is charged with a potential produced in the pseudo-power source circuit. Thereby, the pseudo-power circuits for generating these potentials can be stabilized.

In addition, in a fourteenth aspect of the invention, the MSA can carry out rewriting to a memory cell by using the output of the pseudo-power source circuit depending on the potential of the multi-value data obtained by the discrimination of the MSA itself. Thereby, compared to the method of carrying out step-wise writing, as does the conventional art, the writing time can be reduced.

In addition, in a fifteenth aspect of the invention, the potentials of the sub-bit line pair charged with the potential generated by the pseudo-power source circuit are balanced, and the reference levels that discriminated the uppermost bit of the multi-value data is generated. Thereby, in order to improve the hold characteristics, even in the case that, except for the ground voltage and the inner power source voltage, the potentials are reduced by a specified potential, these reference levels are accordingly lowered by this amount.

In addition, in a sixteenth aspect of the invention, because the rewriting of the dummy cells is carried out by dummy SSAs, a rewriting potential can be produced by selecting the potential generated by the pseudo-power source circuit, and in comparison to the case of using the conventional method and carrying out rewriting from the MSA time necessary for rewriting can be reduced.

In addition, in a seventeenth aspect of the invention, the characteristics of the dummy cell pairs and the dummy word lines are the same as those of the memory cells and word lines. Thereby, there is no need to produce dummy cell pairs and dummy word lines having special capacitance, as has been necessary conventionally, and the problems of increasing area and cost does not occur. In addition, because the capacitances of the cells are uniform compared to conventional art, the degree that their variance influences yield can be reduced.

What is claimed is:

1. A semiconductor apparatus characterized in providing a dummy cell pair that respectively stores the potentials corresponding to each value of multi-value data stored in the memory cells;

a plurality of SSAs that, depending on which among a plurality of sub-arrays that form a memory cell array, a memory cell activated by a selected word line belongs to, acts as a memory sub-sense amplifier (abbreviated "the SSA" hereinbelow) that senses and outputs to a main bit line the potential of said multi-value data read out from the memory cell via a sub-bit line, or acts as a dummy SSA that generates and outputs to a main bit line that is different from said main bit line a reference level that discriminates between said multi-value data by balancing the potentials output from said dummy cell pair via a sub-bit line; and a main sense amplifier (abbreviated hereinbelow "the MSA") that discriminates the value of said multi-value data based on the potential of said multi-value data output to each of said main bit lines and each of said reference levels.

2. A semiconductor apparatus according to claim 1 wherein the plurality of said dummy SSAs sequentially outputs by time division each of said reference levels to said sub-bit lines, and the MSA discriminates the value of said multi-value data by sequentially comparing the potential of said multi-value data to each of said reference levels.

3. A semiconductor apparatus according to claim 1 wherein the output of the plurality of said SSAs that sense the memory cells that are driven by the same word line is supplied to the same main bit line by time division, and at the same time said dummy cell pairs sensed by said plurality of dummy SSAs are driven by an identical dummy word line pair, a main bit line that differs from said main bit lines are supplied with each of said reference levels and one of said plurality of memory SSAs, the potential of each of said multi-value data from said plurality of dummy SSAs, and all of said reference levels are output simultaneously, and the values of each of said multi-value data that the MSA senses by each of said memory SSAs are sequentially discriminated.

4. A semiconductor apparatus according to claim 1 wherein the output of the plurality of said SSAs that sense the memory cells that are driven by the same word line is respectively supplied to a plurality of main bit lines, and at the same time said dummy cell pairs sensed by the plurality of said dummy SSAs are driven by identical dummy word line pairs, each of said reference levels is supplied to separate main bit lines that are different from said plurality of main bit lines and respectively distributed to said plurality of MSAs, and the plurality of said memory SSAs and the all potentials of said multi-value data from said plurality of dummy SSAs, and all of said reference levels are output simultaneously, and all values of said multi-value data that said plurality of the MSAs sense by said plurality of memory SSAs are simultaneously discriminated.

5. A semiconductor apparatus according to claim 1 wherein a switch means is provided for separating the word line that drives the memory cell that is to be read out from the main bit line, the same number of the MSAs as said plurality of the MSAs are disposed surrounding said switch means, and the values of the multi-value data of the memory cells that these MSAs drive simultaneously by said word lines are discriminated in parallel.

6. A semiconductor apparatus according to claim 1 wherein said memory SSA generates and outputs reference levels for distinguishing the highest bit of said multi-value data on the sub-bit line forming a pair with the sub-bit line for reading said multi-value data, and outputs said reference levels to a main bit line that is different from the main bit line that outputs the potentials of said multi-value data.

7. A semiconductor apparatus according to claim 6 wherein said MSA switches the potentials on the two main bit lines depending on whether the potential of the data in the selected memory cell is read by either of two main bit lines among the two main bit lines carrying the respective reference levels that distinguish the potential of said multi-value data and said highest bit of the multi-value data.

8. A semiconductor apparatus according to claim 7 wherein, after passage of a specified time interval during which the noise generated on the sub-bit line has settled, this noise being generated under certain conditions and propagating via word line, said MSA compares the reference levels output by said dummy SSAs to the potentials of the data of said memory cells after it compares the reference levels output by said memory SSAs and the potentials of the data of said memory cells.

9. A semiconductor apparatus according to claim 1 wherein said SSA has an offset cancel means for canceling the offset due to the difference in threshold voltages that exists between the sense transistor pairs that respectively sense the potential of said sub-bit line pairs.

10. A semiconductor apparatus according to claim 1 wherein, among the potentials corresponding to each value of said multi-value data, the potentials, excluding the ground potential and the inner power source potential, are reduced at least to the same specified potential.

11. A semiconductor apparatus according to claim 1 wherein, other than said dummy cell pairs, a redundant dummy cell pair is connected to each of said dummy SSAs via said sub-bit line pair.

12. A semiconductor apparatus according to claim 1 wherein, except for the ground potential and the internal power source potential, potentials corresponding to each value of said multi-value data are respectively generated by a pseudo-power source circuit.

13. A semiconductor apparatus according to claim 12 wherein said sub-bit line in the standby state is charged with a potential generated by said pseudo-power source circuit.

14. A semiconductor apparatus according to claim 13 wherein said MSA uses the output of said pseudo-power source circuit that corresponds to the potential of said multi-value data obtained by said discrimination, and carries out rewriting of said memory cell, which is carried out by a process of reading from said memory cell.

15. A semiconductor apparatus according to claim 13 wherein, by balancing the potentials of the pair of said sub-bit lines charged by a potential generated by said pseudo-power source circuit, the reference levels that discriminate the highest bit of said multi-value data according to claim 6 are generated.

16. A semiconductor apparatus according to claim 1 wherein rewriting of said dummy cell pair, which is carried out by a process of reading from said memory cell, is carried out by said dummy SSA.

17. A semiconductor apparatus according to claim 1 wherein said dummy cell pair and the dummy word line pair that drives said dummy cell pair acquire the same properties as said memory cell and the word line that drives said memory cell.

* * * * *